United States Patent [19]

Yamashita et al.

[11] Patent Number: 4,777,636
[45] Date of Patent: Oct. 11, 1988

[54] PATH TRACE VITERBI DECODER

[75] Inventors: Atsushi Yamashita; Tadayoshi Katoh, both of Kawasaki; Masaru Moriwake, Yokohama; Tadashi Nakamura, Kawasaki, all of Japan

[73] Assignee: Fujitsu Limited, Kanagawa, Japan

[21] Appl. No.: 18,272

[22] Filed: Feb. 24, 1987

[30] Foreign Application Priority Data

Feb. 24, 1986 [JP] Japan .................................. 61-37239
Jul. 17, 1986 [JP] Japan ................................. 61-168758
Jul. 17, 1986 [JP] Japan ................................. 61-168759

[51] Int. Cl.⁴ ............................................. G06F 11/10
[52] U.S. Cl. ...................................................... 371/43
[58] Field of Search .............................. 371/43, 44, 45

[56] References Cited

U.S. PATENT DOCUMENTS 4,630,032 12/1986 Gordon et al. ........................ 371/43
4,709,377 11/1987 Martinez et al. ...................... 371/43

OTHER PUBLICATIONS

Shenoy et al., Serial Implementation of Viterbi Decoders, Comsat Technical Review, vol. 13, No. 2, Fall 1983, pp. 315-330.

*Primary Examiner*—Charles E. Atkinson
*Attorney, Agent, or Firm*—Staas & Halsey

[57] ABSTRACT

A path trace Viterbi decoder comprising an ACS circuit for generating a path selecting signal, a path memory for storing the path selecting signal, a node calculator for calculating the node number of a most likely path on the basis of the data read out from the path memory, and a trace memory for storing the most likely path data, etc. The node number data of the most likely path calculated by the node calculator is stored in the trace memory and the decoding operation is carried out by using the data read from the trace memory.

19 Claims, 29 Drawing Sheets

PATH TRACE VITERBI DECODER

BACKGROUND OF THE INVENTION

1. Field of the Invention

The present invention relates to a path trace viterbi decoder for carrying out an error correction decode of a convolutional code.

The viterbi decoder is used for a maximum likelihood decoding of a convolutional code, which selects a path having a code distance nearest to a received code series from a plurality of known code series as a most likely path, and generates decoded data on the basis of the selected path. The viterbi decoder is used as an error correction apparatus in satellite communication systems due to its excellent error correction ability.

2. Description of the Related Art

A conventional viterbi decoder, in general, comprises a branch metric calculator, an ACS (Add-Compare-Select) circuit, and a path memory, as main components. The branch metric calculator calculates branch metrics for every node on the basis of the received code. The ACS circuit comprises a plurality of ACS units provided for every node, and each ACS unit calculates two path metrics of two paths reaching a node corresponding to the ACS unit in question, compares the calculated path metrics to select a surviving path from the two paths, and outputs a path select signal which indicates the surviving path. The path memory receives the path select signals from the ACS circuit, and stores a most likely path history on the basis of the path select signals.

The path memory comprises memory cells, having a selector and a flip-flop, and connected in cascade over the path history length. However, it is difficult to integrate such a path memory.

On the other hand, the path memory may comprise a RAM (Random Access Memory). However, in this case, the number of times the RAM must be accessed for one decoding cycle in which one symbol is decoded is high, and therefore, the decoding rate is lowered.

To solve these problems there is provided a trace back type path trace viterbi decoder which may be integrated using a RAM as the path memory. With such a decoder the decoding rate increased over the above RAM decoder. The trace back type viterbi decoder calculates the node number of the node selected as a survivor at a previous trellis level, on the basis of the node number of the node having a minimum path metric and a path selecting signal corresponding to the above node at beginning of the tracing, calculates the surviving node at a further previous level of the calculated node number, repeats this calculation over the path history length (i.e., the length of the path memory) to obtain the most likely path, and generates a decoded signal on the basis of the node number of the final node to which the most likely path finally extends.

This viterbi decoder, however, must trace the most likely path over the whole length of the path history to obtain the decoded signal of one symbol, and accordingly it must access the path memory many times. As a result, the decoding rate is not sufficiently high.

SUMMARY OF THE INVENTION

According to the fundamental aspect of the present invention, there is provided a viterbi decoder comprising: a branch metric calculator for calculating branch metrics for every node on the basis of a received signal; a path selecting unit for selecting a surviving path for every node on the basis of path metrics calculated on the basis of the branch metrics from the branch metric calculator to output path selecting signals indicating the surviving paths respectively; a path memory for storing the path selecting signals generated by the path selecting unit over a path history length of every node; a node calculator for tracing the most likely path by repeating a calculation in which a previous node with respect to a given node is calculated on the basis of the node number of the given node and the path selecting signal corresponding to the given node; a trace memory for storing the most likely path data generated by the node calculator; an updating unit for updating the most likely path data in the trace memory on the basis of the calculated result of the node calculator; and a decoding unit for generating a decoded signal on the basis of the most likely data stored in the trace memory.

BRIEF DESCRIPTION OF THE DRAWINGS

Embodiments of a path trace viterbi decoder in accordance with the present invention will now be described with reference to the accompanying drawings, in which.

DESCRIPTION OF THE PREFERRED EMBODIMENTS

For a better understanding of the preferred embodiments, the problems of the related art viterbi decoder (hereinafter referred to as a trace back type viterbi viterbi decoder) will be first explained in detail with reference to FIGS. 1 to 3.

Figure 1:
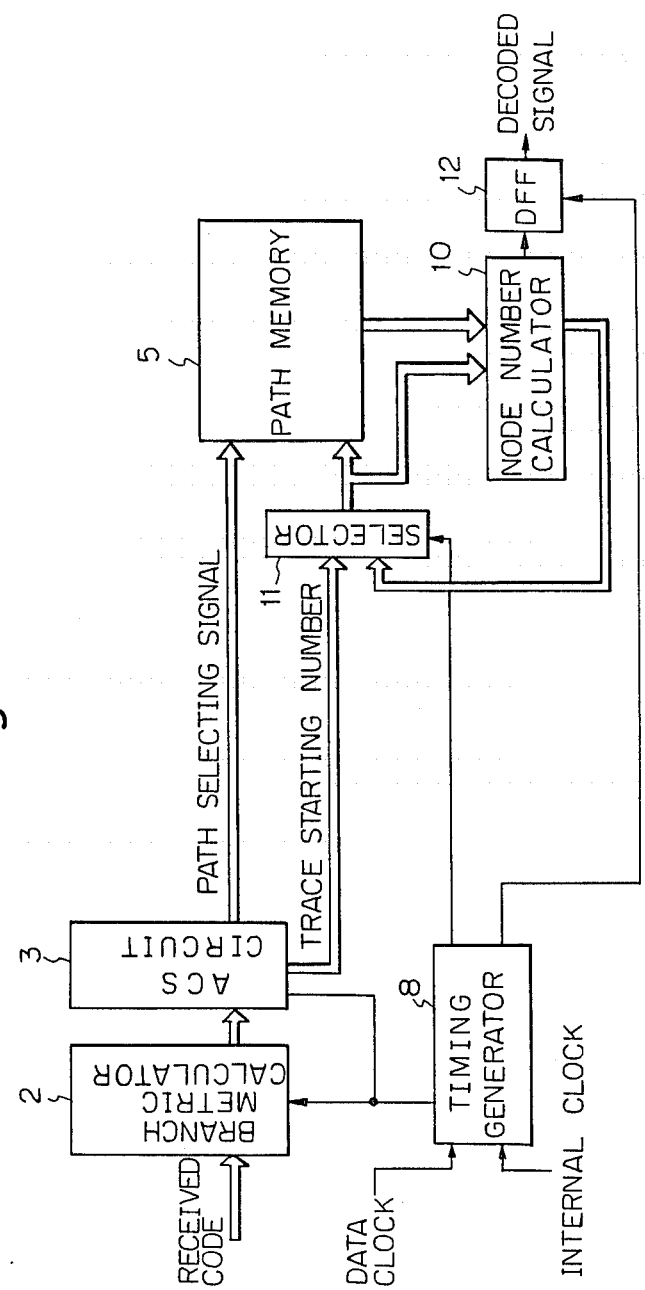
FIG. 1 is a schematic block diagram of the trace back type viterbi decoder.

FIG. 1 shows a schematic block diagram of the trace back type viterbi decoder. In FIGS. 1, 2 denotes a branch metric calculator; 3, an ACS circuit; 5, a path memory; 8, a timing generator; 10, a node number calculator; 11, a selector; 12, a D flip-flop. The branch metric calculator calculates branch metrics for each node on the basis of the received code. The ACS circuit comprises a plurality of ACS units provided for each node, and each ACS unit calculates two path metrics of two paths which reach a node corresponding to the unit in question on the basis of branch metrics from the branch metric calculator 2, then compares two calculated path metrics to select a surviving path from the two paths, and outputs a path selection signal indicating the surviving path. The path memory 5 stores the path selection signal for each node over the path history length corresponding to the predetermined number of stages. The timing generator 8 generates timing pulses for controlling the timing of each circuit in FIG. 1. The node number calculator 10 carries out a sequence of calculations to trace a most likely path. In this sequence, a previous level node which the surviving path has reached is calculated on the basis of a given node and the path selecting signal corresponding to that node, then a further previous level node is calculated on the basis of the path selecting signal corresponding to the calculated node, which is read out from the path memory 5, and these calculations are repeated in sequence. The selector 11 selects either a node number of the trace starting node received from the ACS circuit 3 or the calculated node number received from the node number calculator 10, to designate an address for reading out the path selection signal corresponding to the calculated node number for the path memory.

The operation of this viterbi decoder will be explained hereinafter. FIG. 2 shows drawing for explaining the path tracing operation. In FIG. 2, node numbers 0 to 7 of each node the binary notation, path metrics for each node, and path selecting signals for each node stored in the path memory 5 are denoted respectively. The number of stages of the path memory is desirably five or six times the constraint length. In FIG. 2, eight stages of the path memory are shown to simplify the explanation.

First, The ACS circuit 3 calculates path metrics, then selects the surviving path by comparing calculated path metrics, and outputs path selecting signals PS-0 to PS-7 (0 or 1). These path selecting signals PS-0 to PS-7 are written into the path memory 5 in such a manner that they are added to the head position of the content of the path memory 5. These path selecting signals correspond to the MSB (Most Significant Bit) of the binary notation node number selected as the survivor respectively.

The tracing may be started from any node, but preferably, the node having the minimum path metric is selected as the trace starting node. In FIG. 2, the node number 7 having the minimum path metric 62 is set as the trace starting node.

Here, assuming that the node number of the trace starting node is $N_{00}$ ($N_{00}$ represents values from 0 to $2^k-1$, K is the contraint length, a coding rate is $\frac{1}{2}$), and the content of the path memory corresponding to the node number $N_{00}$ is $PS_{00}$. An upper digit of the attached number of $N_{00}$ and $PS_{00}$ denotes the decoding cycle number, and a lower digit thereof denotes a level number of the tracing. In FIG. 2, the lower digit may assume values form 0 to 7. At the beginning of the tracing, the ACS circuit corresponding to the node $N_{00}$ selects a transition from the node $N_{01}$ as the surviving path. The node $N_{01}$ is calculated as follows.

$$N_{01} = 2^{k-2} \times PS_{00} + \lfloor \frac{N_{00}}{2} \rfloor \quad (1)$$

Where, $$\lfloor \frac{N_{00}}{2} \rfloor$$

is an integer having a maximum value lower than N/2. Therefore, the node $N_{02}$ of the previous level is calculated by reading out the content, i.e. path selecting signal $PS_{01}$, of the path memory 5 corresponding to the node $N_{01}$. Such operation is repeated in sequence, and the decoded signal is obtained from the node number of the final node finally reached as a result of tracing the whole length of the path history (i.e., path memory length). The decoded signal is, in general, an LSB (Least Significant Bit) of the finally reached node number represented by the binary notation.

The above-mentioned operation will be explained in more detail. At the level 0, the node number $N_{00}=7$ having the minimum path metric is chosen, and the path selecting signal corresponding to the node $N_{00}$ is the newest path selecting signal $PS_{00}=1$. The calculation of the afore-mentioned expression (1) is carried out on the basis of the node number $N_{00}=7$ and path selection signal $PS_{00}=1$, i.e., $4 \times 1 + 3 = 7$, and as a result, the node number $N_{01}=7$ is obtained.

Accordingly, at the following level 1, the node number $N_{02}=7$ is calculated by using the node number $N_{01}=7$ and the content $PS_{01}=1$ of the path memory corresponding to $N_{01}$, then at the further following level 2, the node number $N_{03}=3$ is calculated by using the node number $N_{02}=7$ and the content $PS_{02}=0$ of the path memory. The calculation of the node number is carried out in the same way and, finally, at level 7, the node number $N_{08}=4$ is calculated. When the node number $N_{08}=4$ is the final node, the LSB of the node number $N_{08}=$"100" represented by the binary notation is "0", therefore the decoded signal is "0", which corresponds to the LSB thereof.

In this trace back type viterbi decoder, a most likely path tracing period in which the most likely path is once traced over the path history length coincides with a decoding period in which the decoded signal of one symbol is generated, accordingly the tracing of the most likely path over one path history length must be carried out at every decoding cycle in order to generate the decoded signal of one symbol, which increases the number of times of access to the path memory. Therefore, the period of decoding is lengthened due to this long tracing period, that is, the decoding rate is lowered.

The present invention provides a path tracing viterbi decoder in which above-mentioned problems are solved and the decoding rate is raised, and an outline of an operation thereof will be first explained hereinafter.

Figure 2:
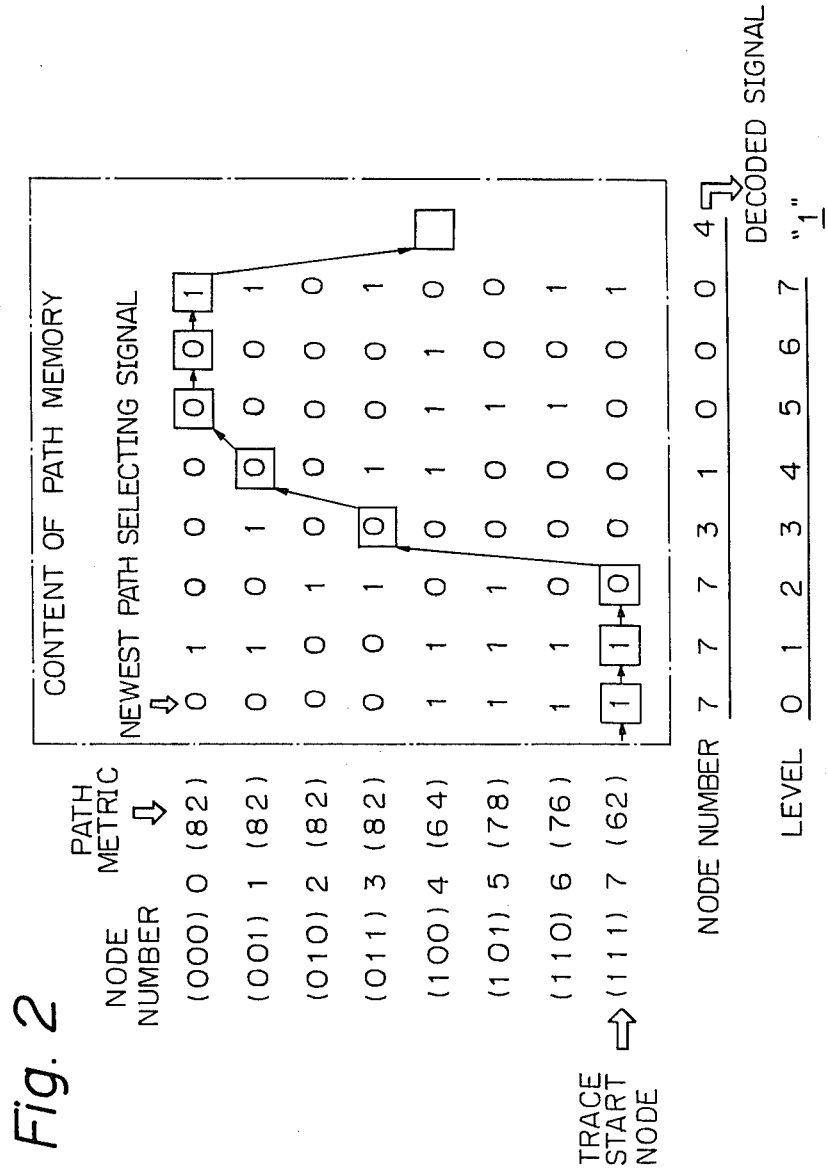
FIGS. 2 and 3 are drawings for explaining the path tracing operation.

It is assumed that one most likely path as shown in FIG. 2 has been traced over the path history length at a certain decoding cycle. FIG. 3 shows the tracing of the most likely path at the decoding cycle following the decoding cycle of FIG. 2. At this decoding cycle, new path selecting signals are generated by the ACS circuit 3 and are written into the path memory 5. Accordingly, the content of the path memory becomes such that the new path selecting signals are added at the head portion and the content shown in FIG. 2 is wholly shifted by one stage. At the decoding cycle of FIG. 3, the minimum path metric node is the node number 1 having the path metric 0, and thus the tracing is started from this node 1. If the node numbers of the most likely path are calculated in the same way as in FIG. 2, $N_{10}=0$, $N_{11};32$ 4, $N_{12}=6$, $N_{13}=7$, $N_{14}=3$, $N_{15}=1$, $N_{16}=0$, $N_{17}=0$, and $N_{18}=0$ are obtained. Since the final node number $N_{18}$ represented in binary notation is "000", the LSB thereof, i.e., "0", becomes the decoded signal.

Figure 3:
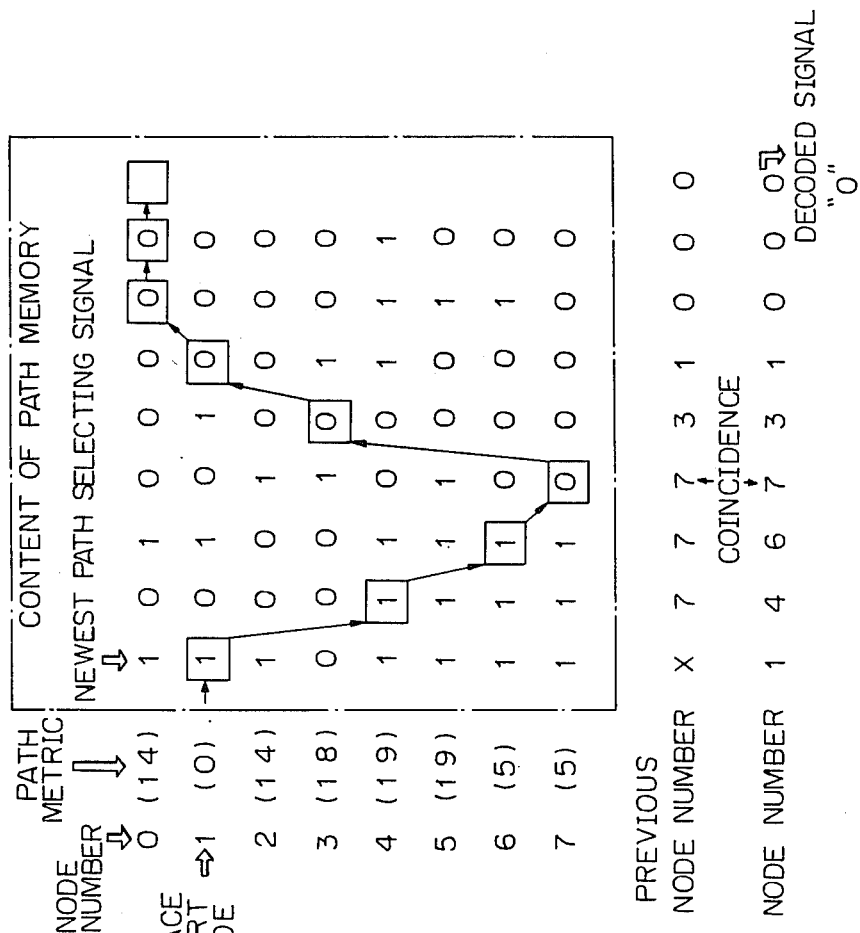

Comparing the most likely path shown in FIG. 3 with that shown in FIG. 2, boths paths are different at the beginning of the tracing, but both paths take the same route after both paths coincide. That is, in this example, both paths of FIGS. 2 and 3 take the same path after the node number 7 at a level 3 of FIG. 3 coincides with the node number 7 at a level 2 of FIG. 2.

As described above, the most likely path traced at a certain decoding cycle almost coincides with the path traced in a decoding cycle prior to the above-mentioned decoding cycle by cycle, and especially when the path history length is long enough, a latter portion of the most likely path coincides therewith. In this way, when several most likely paths are consecutively traced, the latter portions of these paths become almost the same.

The trace back type viterbi decoder generates the decoded signal from the final node of the most likely path, and the final node of a certain most likely path is a node in front of the final node of the previous most likely path. Accordingly, by storing the most likely path data once traced in the trace memory and reading out node numbers in the direction from the final node toward the head one by one in sequence at every decoding cycle, correct decoded signals may be obtained at least at the latter portion of the most likely path. Accordingly, it is not necessary to trace a whole most likely path every time to obtain one symbol decoded signal. Therefore, it is possible to trace a new most likely path while several decoded signals are obtained on the basis of the already traced most likely path, and then to obtain following decoded signals from the newly traced most likely path.

In accordance with the present invention, two methods are provided to realize the above-mentioned operation. One is referred to as a coincidence comparing method and the other as a division method, for convenience. In the coincidence comparing method, the new most likely path is compared with the past most likely path during the trace calculation of the new path in sequence, and if these paths coincide, the tracing of the new most likely path is terminated and the past most likely path is utilized as the path thereafter. Accordingly, the tracing of the whole of the most likely path over the path history length for every decoding cycle becomes unnecessary, which shortens the tracing time of the most likely path and improves the decoding rate.

In the division method, the period for tracing one most likely path is divided by a plurality of decoding cycles. The most likely path already obtained is stored in the trace memory, and the decoded signal is obtained on the basis of this stored past most likely path. A new most likely path is traced while a plurality of decoded cycles are carried out, and following decoded signals are obtained from this updated most likely path.

the coincidence comparing type and division type viterbi decoders will now be explained in detail hereinafter.

Figure 4:
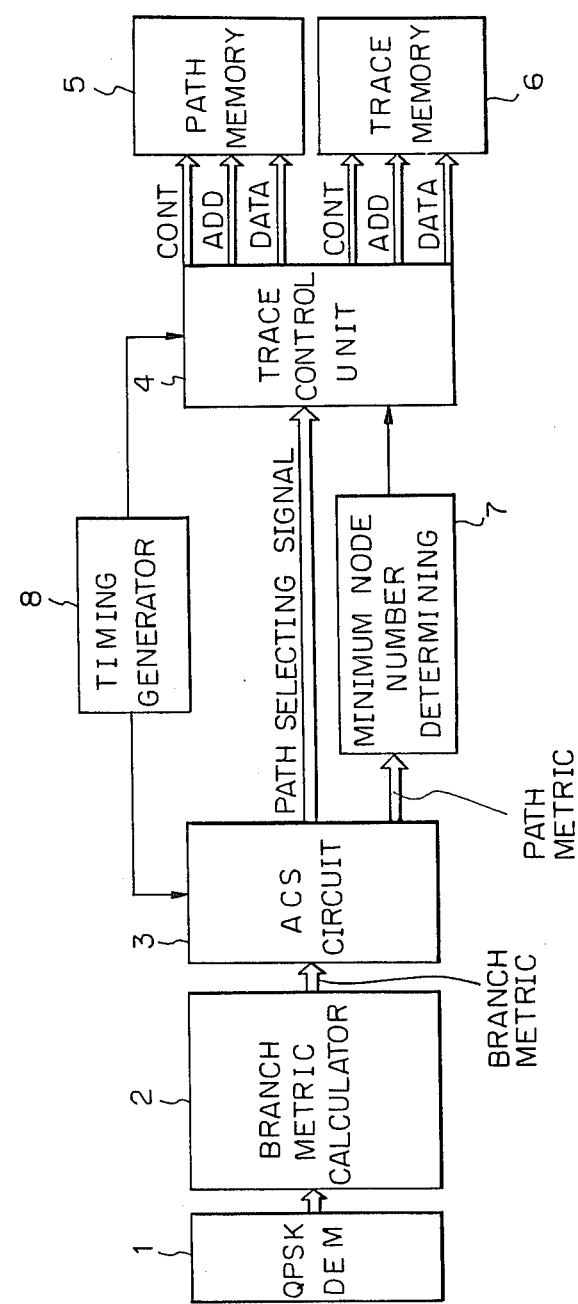
FIG. 4 is a schematic block diagram of an embodiment of the coincidence comparing type viterbi decoder in accordance with the present invention.

FIG. 4 shows a block diagram of an embodiment of the coincidence comparing type viterbi decoder. In this embodiment, the constraint length K of the convolutional code is 4, and therefore the number of nodes is 8.

In FIG. 4, 1 denotes a QPSK demodulator; 2 a branch metric calculator; 3, an ACS circuit; 4, a trace control unit; 5, a path memory; 6, a trace memory; 7, a minimum path metric node determining circuit; 8, a timing generator. The QPSK demodulator 1 demodulates a received QPSK signal to output received codes I and Q, and the branch metric calculator 2 calculates branch metrics BM-0 to BM-7 for every node on the basis of the received codes and sends them to the ACS circuit 3.

Figure 5:
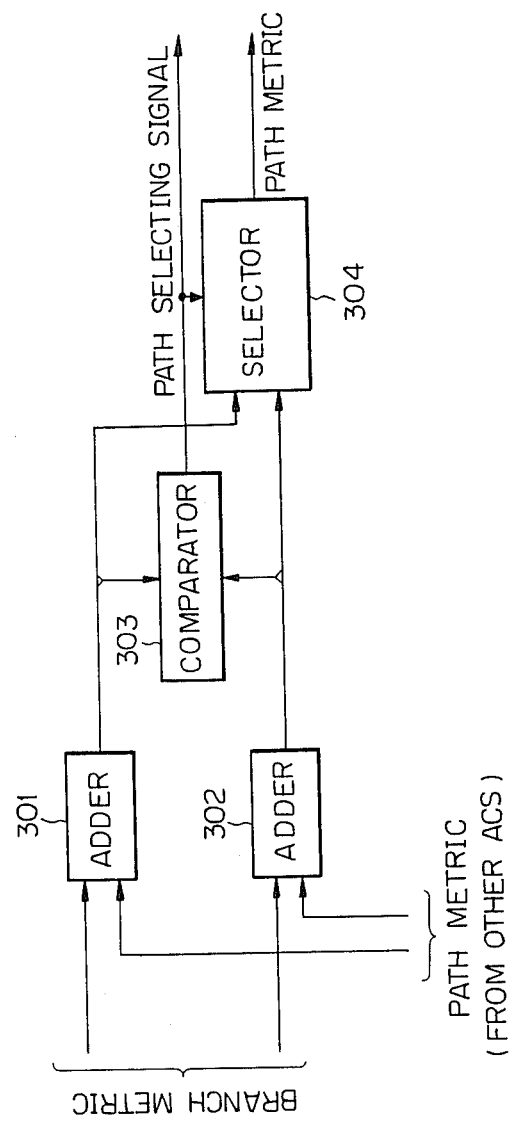
FIG. 5 is a block diagram of the ACS unit.

The ACS circuit 3 comprises a plurality of ACS units (e.g., eight) one for each node. The number of nodes, which is calculated by $2^{k-1}$, is 8, since the constraint length K is 4. Each of the ACS units comprises, as shown in FIG. 5, two adders 301 and 302, a comparator 303, and a selector 304. In each ACS unit, branch metrics of two paths which reach the node corresponding the unit in question are input to one input terminal of adders 301 and 302, respectively, and path metrics are input to the other input terminal thereof from other ACS units corresponding to the two paths. Each ACS unit operates according to the timing clock from the timing generator 8, so that the branch metric and the path metric of one previous symbol are added by adders 301 and 302. Then the new path metrics obtained by above-mentioned calculation are compared by the comparator 303 to output the path selecting signal to the selector 304, which selects a smaller path metric in response to the path selecting signal. The selected path metric is supplied to the minimum path metric node determining circuit 7, and the path selecting signal is supplied to the trace control unit 4.

The minimum path metric node determining circuit 7 receives path metrics for every node from the ACS circuit 3 and determines the node having the minimum path metric from received path metrics to output the minimum path metric node number to the trace control unit 4. The path memory 5 stores path selecting signals for every node over the path history length, and is constituted by the RAM. The trace memory 6 stores node number data of the traced most likely path over the path history length, and is also constituted by the RAM. The trace control unit 4 carries out an operation for tracing the most likely path on the basis of the path selecting signal and the node number, and writes the traced node data into the trace memory 6.

Figure 6:
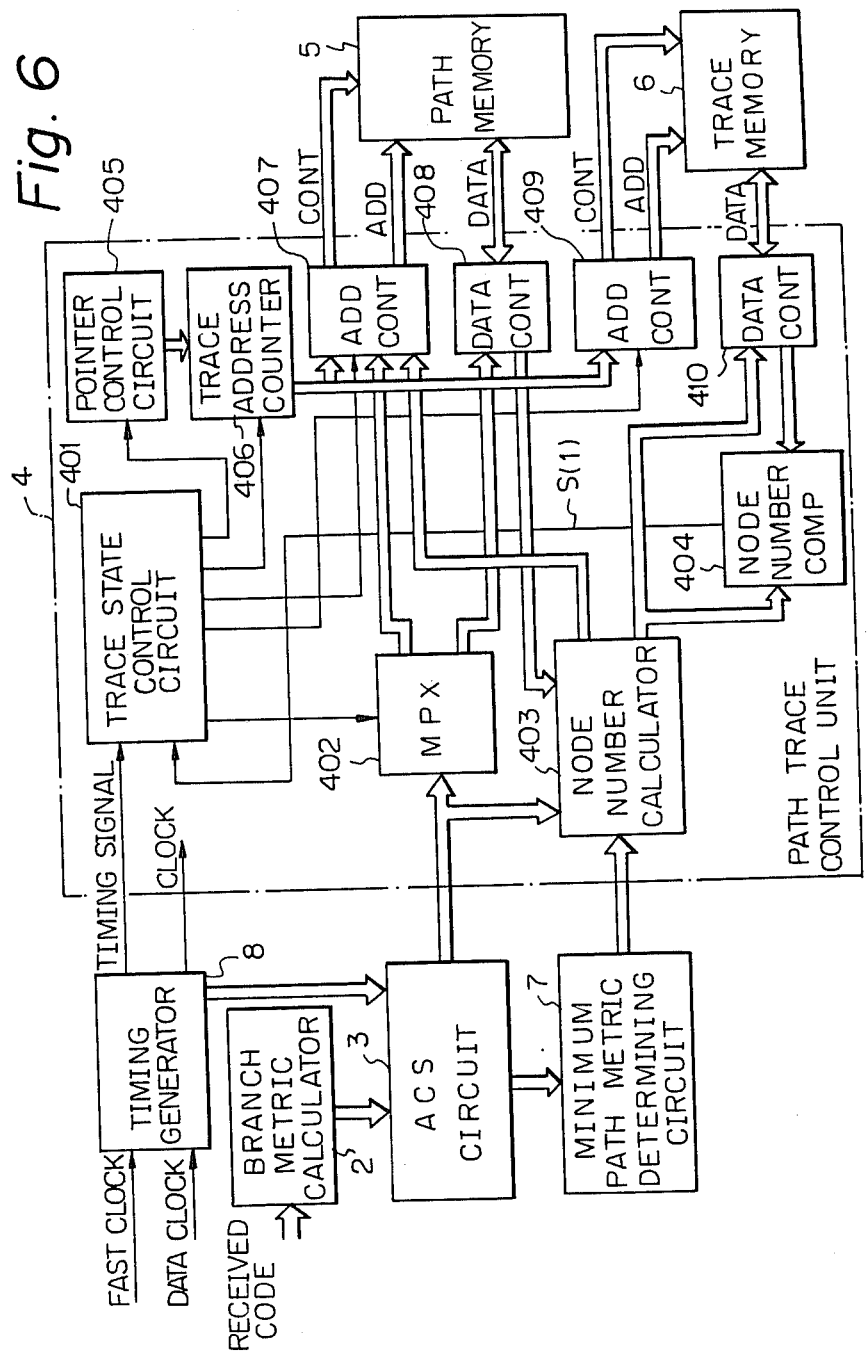
FIG. 6 is a block diagram of the trace control unit as an example.

FIG. 6 shows a block diagram of the trace control unit 4 in detail as an example. In FIG. 6, 401 denotes a trace state control circuit; 402; a multiplexer; 403, a node number calculator; 404, a node number comparator; 405, a pointer control circuit; 406, a trace address counter; 407 and 409, address control circuits; and 408 and 410, data control circuits. Address control circuits 407 and 409 respectively control the switching between the read mode and write mode for the path memory 5 and the trace memory 6, and the addressing therefor. Data control circuits 408 and 410 respectively control the data read and write operations for the path memory 5 and the trace memory 6. The node number calculator 403 calculates the node number for tracing the most likely path according to the aforementioned expression (1), and the calculated node number is written into the trace memory 6.

The node number comparator 404 compares the node number calculated by the node number calculator 403 with the node number read out from the trace memory 6 to detect a coincidence thereof, and outputs a coincidence signal S(1) to the trace state control circuit 401 when such a coincide occurs. The pointer control circuit 405 controls a pointer which indicates a head address for accessing the path memory 5 and the trace memory 6 at each decoding cycle, and shifts the pointer by one for every decoding cycle. The trace address counter 406 indicates a tracing address in sequence on the basis of the head address of the pointer control circuit 405. The trace state control circuit 401 operates according to the timing pulse from the timing generator 8 and switches a trace state in response to the coincidence signal S(1) from the comparator 404.

The operation of the embodiment will now be explained hereinafter. In this embodiment, the most likely path already obtained by the previous tracing has been stored in the trace memory 6, and that stored most likely path data is compared with the node number calculated by the node number calculator 403 for every calculation of the node number. When both node numbers coincide, the path tracing is terminated to finish the current decoding cycle, whereby the following decoding cycle, in which a new most likely path is traced, is started.

One decoding cycle comprises one I/O (input-output) state and two trace states. In the I/O state, the write operation of the path selecting signal and the read operation of the decoded signal are carried out, and in the trace state, the calculation of the node number and the comparison between the calculated node number and the content of the trace memory are carried out. If a coincidence is not obtained during one decoding cycle, the path tracing is continued over the following decoding cycle, and this process is repeated until a coincidence is obtained. The above-mentioned operation will be explained in detail with reference to the drawings.

The received codes demodulated by the QPSK demodulator 1 are input to the branch metric calculator 2 in which branch metrics for every node are calculated on the basis of the received codes and output to the ACS circuit 3. The ACS circuit 3 generates path selecting signals and path metrics for every node on the basis of the branch metrics and outputs path selecting signals to the path memory, and path metrics to the minimum path metric node determining circuit 7, respectively. The path selecting signal indicates the path selected as the surviving path from two paths each reaching the node in question. The minimum path metric mode determining circuit 7 determines the node having the minimum path metric on the basis of path metrics received for every node and sends the node number thereof to the trace control circuit 4.

The trace control unit 4 controls such operations as the write operation of received path selecting signals to the path memory 5, the read operation of the decoded signal form the trace memory 6, the read operation of the path selecting signal from the path memory 5 for using the trace calculation according to expression (1), the read operation of the data from the trace memory 6 for use in the comparison between the traced result and the previous most likely path data, and the write operation of the traced result into the trace memory 6.

Figure 7:
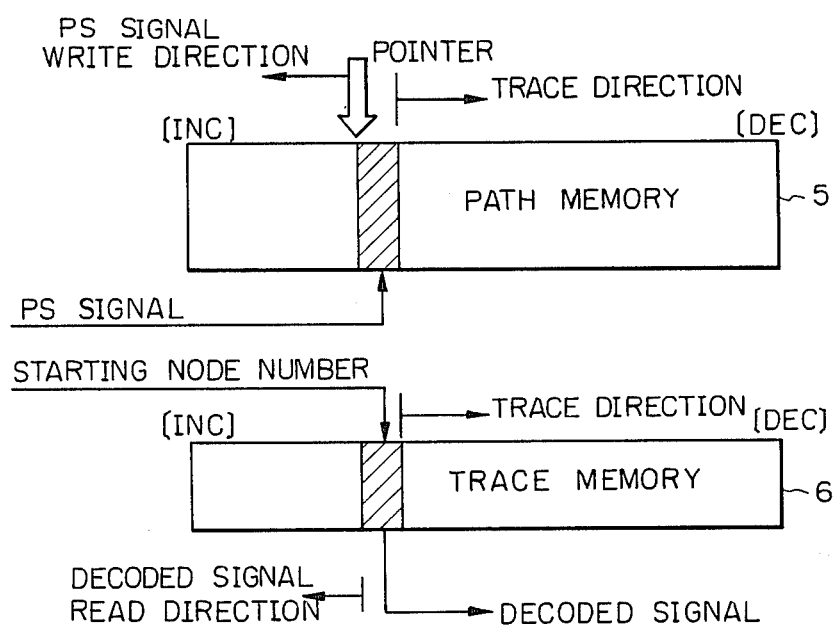
FIG. 7 is a drawing for explaining the manner of addressing the path memory and the trace memory.

FIG. 7 is a drawing for explaining the manner for addressing the path memory 5 and the trace memory 6. In FIG. 7, the address of memories 5 and 6 increases in the left direction, i.e., decreases in the right direction. When the address increases, it finally reaches a maximum address thereof (i.e., a lefthand end of the memories in FIG. 7), and then jumps to a minimum address (i.e., a righthand end of the memories in FIG. 7), and further continues to increase therefrom. On the other hand, when the address decreases, it finally reaches the minimum address and then it jumps to the maximum address, and further continues to decrease therefrom. In the memories 5 and 6, the newest data is written in counterclockwise direction in sequence, and accordingly, the data generally becomes older as the address decreases in the righthand direction.

The received newest path selecting signals is written at the address of the path memory 5 indicated by the pointer controlled by the pointer control circuit 405. The address position corresponds to the head position of the content of the path memory 5, and is shifted in the counterclockwise direction as the decoding is carried out. On the other hand, a tracing direction, i.e., a direction for reading out the data in sequence from the path memory for trace calculation, is shifted in the clockwise direction in FIG. 7, since the tracing must go back to the past along the most likely path.

In the trace memory 6, the trace starting node number is written at the afore-mentioned address indicated by the pointer at the beginning of the tracing, then the calculated node number is written sequentially in the clockwise direction, since the node number calculation must be made by returning to the past along the most likely path. Also, the previous most likely path data for the comparison is read out sequentially in the clockwise direction. Note, the previously stored content of the trace memory 6 at the address where the trace starting node number is written at the beginning of the tracing corresponds to the final level node number of the previous most likely path, and accordingly that content is read out to obtain the decoded signal prior to writing the trace starting node number.

Figure 8:
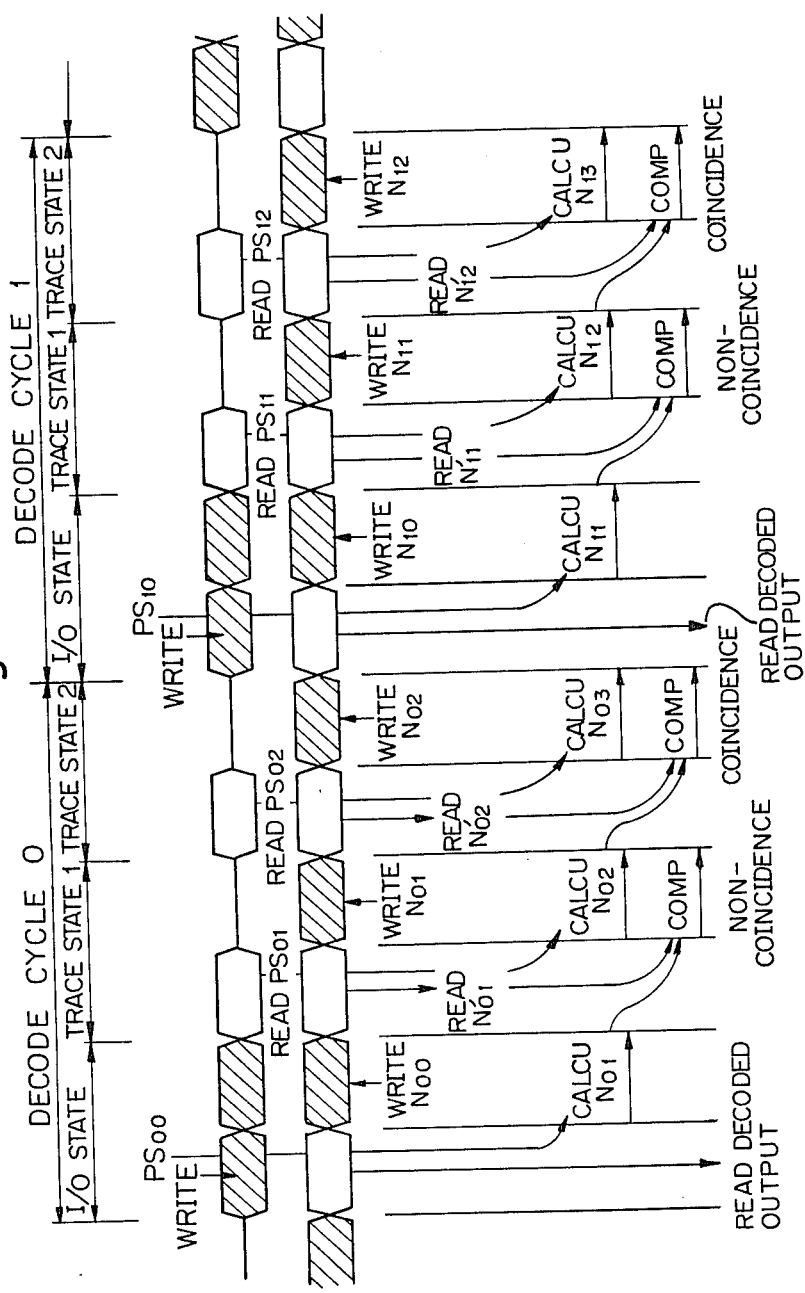
FIG. 8 is a timing chart showing access timings for the path memory and the trace memory.

FIG. 8 is a timing chart showing access timing for the path memory 5 and the trace memory 6. In FIG. 8, a new decoding cycle 0, in which the tracing of the new most likely path begins, is started. In the I/O state of the decoding cycle 0, at the first clock timing, the decoded signal is read out from the address of the trace memory 6, indicated by the pointer, and the newest path selecting signal is written into the corresponding address of the path memory 5. In this decoding cycle, the minimum path metric node number from the node determining circuit 7 is the trace starting node number $N_{00}$, and the received newest path selecting signal is the path selecting signal $PS_{00}$ corresponding to the node number $N_{00}$. Accordingly, at a second clock timing, the calculation of the node number $N_{01}$ according to the aforementioned expression (1) is carried out by the node number calculator 403. At the same time, the trace starting node number $N_{00}$ is written at the aforementioned address of the trace memory indicated by the pointer.

In the following trace state 1, at a first clock timing, the content $PS_{01}$ of the path memory 5, which corresponds to the calculated node number $N_{01}$, is read out from the path memory 5, and at the same time, the node number $N_{01}'$ of the previous most likely path, which corresponds to the node number $N_{01}$, is read out from the trace memory 6. The addressing of this read operation is carried out in the tracing direction (i.e., to the right in FIG. 7) by the trace address counter 406. The node number comparator 404, at a second clock timing, compares the calculated node number $N_{01}$ with the read out node number $N_{01}'$ to determine whether or not they coincide. At the same time, the node number calculator 403 calculates the node number $N_{02}$ on the basis of the calculated node number $N_{01}$ and the read path selecting signal corresponding to the $N_{01}$, and the calculated node number $N_{01}$ is written into the address of the trace memory 6, from where the node number $N_{01}'$ was read out.

If the node number $N_{01}$ coincides with the node number $N_{01}'$ at this trace state 1, the comparator 404 outputs the coincidence signal S(1) to the trace state control circuit 401. The control circuit 401 terminates the path tracing immediately in response to the coincidence signal S(1), then starts the following new decoding cycle. However, if the node number $N_{01}$ does not coincide with the node number $N_{01}'$, as shown in FIG. 8, the trace state 2 is carried out. In the trace state 2, the path selecting signal $PS_{02}$ and the node number $N_{02}'$ are read out, then the comparison between node numbers $N_{02}$ and $N_{02}'$, the calculation of the node number $N_{03}$, and the write operation of the node number $N_{02}$ are carried out. If the comparator 404 detects a coincidence between the node numbers, the decoding cycle 0 is terminated and the new decoding cycle 1 is started.

In the decoding cycle 1, the address of the pointer is shifted by one in the counterclockwise direction in FIG. 7, and the same operation as in the aforementioned decoding cycle 0 is repeated. The tracing of the most likely path is started from the trace starting node number $N_{10}$.

Figure 9:
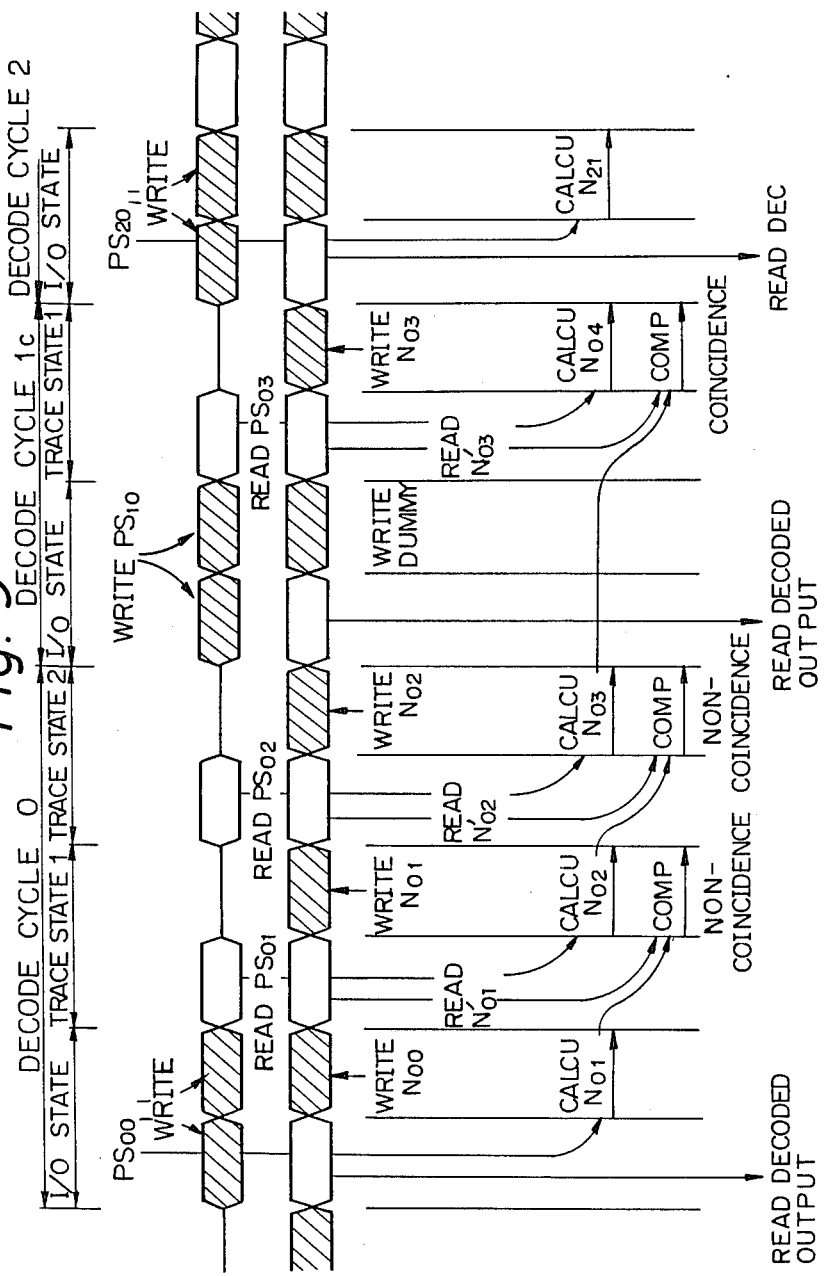
FIG. 9 is a timing chart when the path tracing is not terminated within one decoding cycle.

A time chart of FIG. 8 shows the case in which the coincidence is obtained and the tracing is terminated within the period of one decoding cycle. However, if as a result of the comparison the coincidence is not obtained, the path tracing is not terminated and is continued in the following decoding cycle. FIG. 9 shows a time chart when the path tracing is not terminated within one decoding cycle.

In FIG. 9, the tracing of the most likely path is begun at the I/O state of the decoding cycle 0, but a comparison between node numbers $N_{02}$ and $N_{02}'$ at the trace state 2, shows that they do not coincide. In such a case, the path tracing is not terminated in the decoding cycle 0 but is continued in the following decoding cycle $1_c$.

That is, the continued decoding cycle $1_c$ is carried out, and at the I/O state thereof, the node number calculation is inhibited. The read operation of the decoded signal from the address position newly shifted by one by the pointer, the write operation of the predetermined node number to that address position, and the write operation of the newest path select signals at said address position are carried out. The minimum path metric node number determined by the node determining circuit 7 or a non-existent dummy node number (i.e., coincidence is never obtained) may be used as the above-mentioned predetermined node number, as described in detail hereinafter.

In the following trace state 1, first, the read operation of the path selecting signal $PS_{03}$ corresponding to the node number $N_{03}$ calculated at the trace state 2 of the decoding cycle 0, from the path memory 5, and the read operation of the node number $N_{03}'$ from the trace memory 6 are carried out, and then the calculation of the node number $N_{04}$ and the comparison between node numbers $N_{03}$ and $N_{03}'$ are carried out. If the node numbers $N_{03}$ and $N_{03}'$ coincide as a result of the comparison, the path tracing is immediately terminated and a decoding cycle 2 in which the most likely path is newly traced is started. The operation in this decoding cycle 2 is the same as that in the decoding cycle 0.

Figure 10:
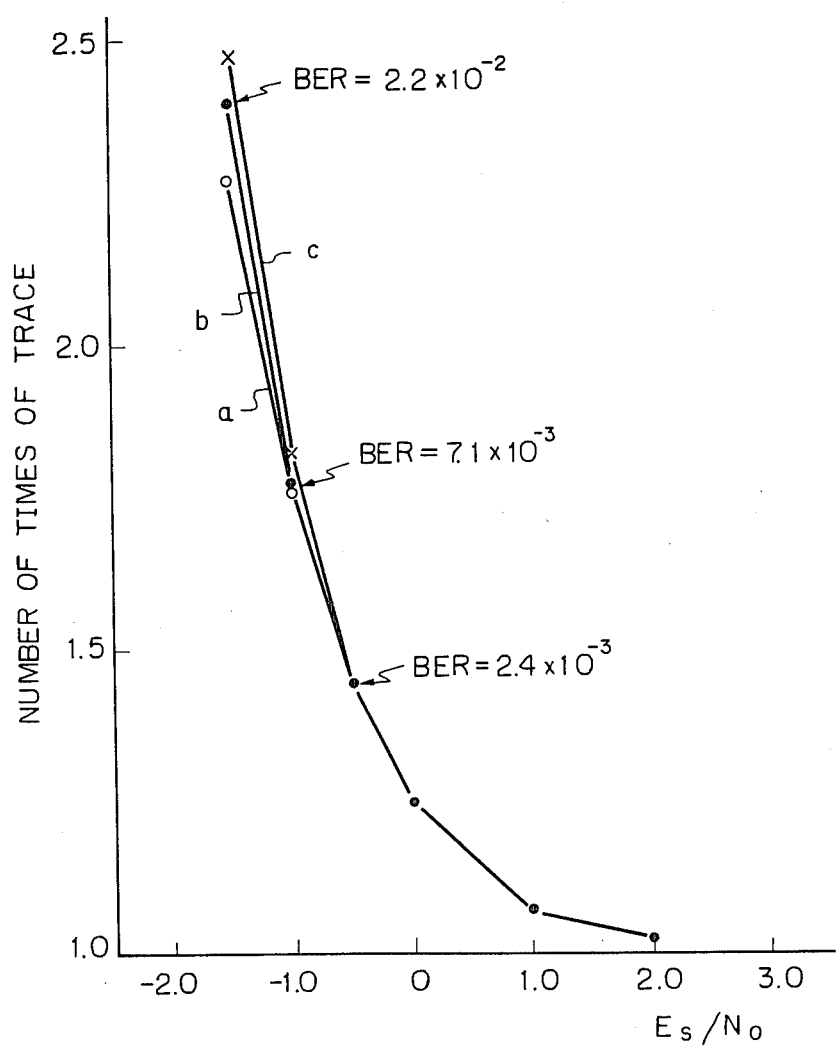
FIG. 10 shows the characteristic curve for the number of times of tracing.

FIG. 10 shows characteristic curves for the number of times of tracing. These characteristic curves show the relationship between average number of times that the tracing is carried out within one decoding cycle and a signal to noise ratio ($E_s/N_o$) of the decoded signal for the average number of times of tracing. These characteristic curves are obtained for the received code wherein the coded ratio is ½, the constraint length is K=7, and the 8-level soft decision is provided. In FIG. 10, an abscissa represents the signal to noise ratio ($E_s/N_o$); and an ordinate, the average number of times of the tracing. Curves a, b, and c are curves occurring when the lengths of the path memory are 32 stages, 48 stages, and 64 stages respectively. BER (Bit Error Rate) is a bit error value after decoding, when the length of the path memory is 48 stages. As is clear from these curves, the average number of times of tracing is lower than two, if a channel error rate becomes extremely bad.

Figure 11:
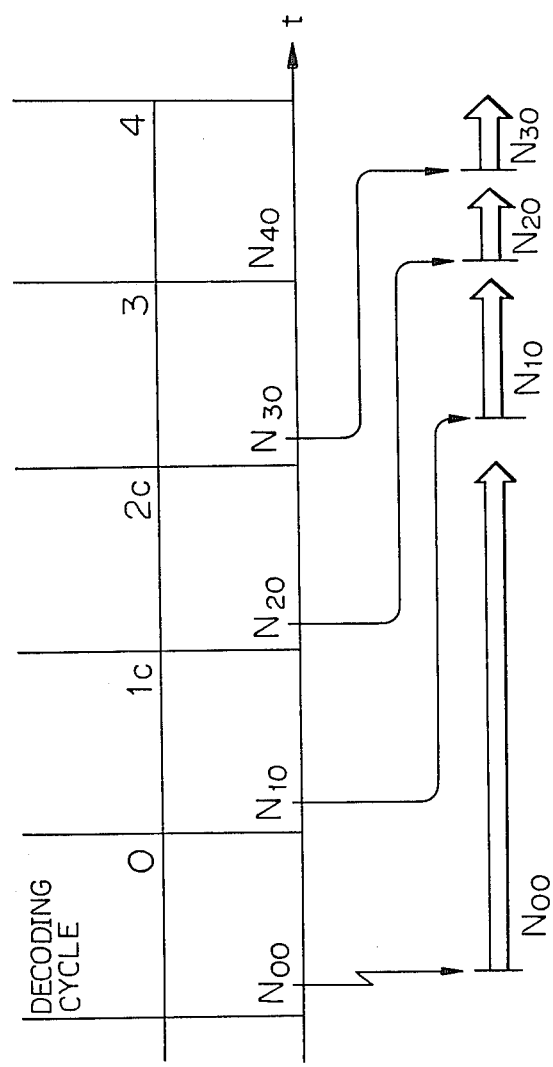
FIGS. 11 to 13 show trace restarting methods respectively.
Figure 12:
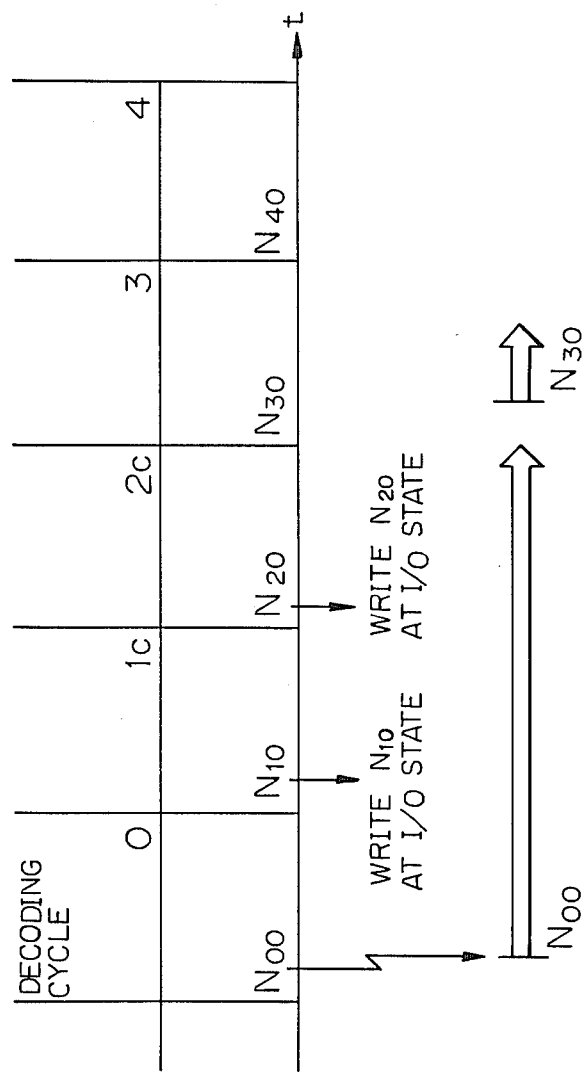
Figure 13:
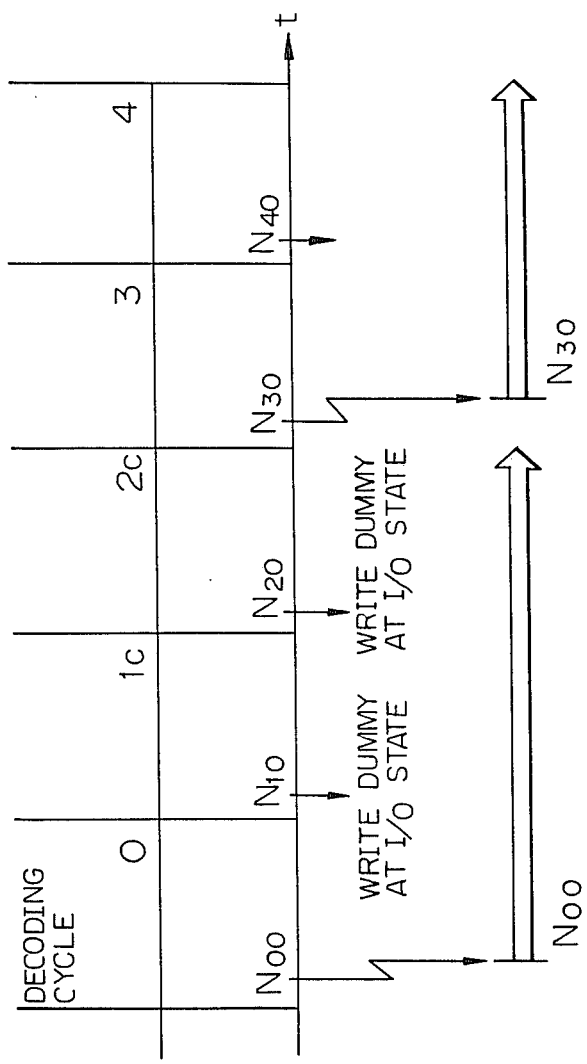

When the path tracing is not terminated in one decoding cycle, a new path tracing is restarted in a new decoding cycle after the tracing is terminated in the continued decoding cycle. In this case, three ways of restarting the path tracing may be proposed. FIGS. 11 to 13 show trace restarting methods respectively. In FIGS. 11 to 13, $N_{00}$, $N_{10}$, $N_{20}$, $N_{30}$, and $N_{40}$ are the minimum path metric node number determined by the node determining circuit 7 in each of the decoding cycles 0 to 4 respectively. In each method, the path tracing is started from the trace starting node $N_{00}$ in the decoding cycle 0, the coincidence is obtained in the continued decoding cycle $2_c$, so that the tracing is terminated, and the path tracing is then restarted in the decoding cycle 3.

The restarting method I shown in FIG. 11 uses the minimum path metric node number $N_{10}$ as the trace starting node number in the decoding cycle 3 in which the path tracing is restarted. During the continued decoding cycles $1_c$ and $2_c$, the write operation of the trace starting node number to the trace memory 6 at the I/O state thereof may not be carried out, or the minimum path metrics $N_{10}$ and $N_{20}$ may be written respectively. If the restarted path tracing is terminated during the the decoding cycle 3, the path tracing is further started from the trace starting node number $N_{20}$ in the decoding cycle 4.

The restarting method II shown in FIG. 12 uses the minimum path metric node number $N_{30}$, which is the original trace starting node number in the decoding cycle 3, as the trace starting node number in the restarted decoding cycle 3. At the I/O states of the continued decoding cycles $1_c$ and $2_c$, the node numbers $N_{10}$ and $N_{20}$, which are the original starting node numbers in decoding cycles 1 and 2 respectively, are written to the trace memory 6 as the head side data of the most likely path.

The restarting method III shown in FIG. 13 also uses the node number $N_{30}$ as the trace starting node number in the restarted decoding cycle 3, which is the same as the restarting method II. However, different from the method II, in this restarting method III, the dummy node numbers (which do not exist) are written at the I/O states of the continued decoding cycles $1_c$ and $2_c$ instead of the node numbers $N_{10}$ and $N_{20}$. When the dummy number is used, the coincidence is not obtained at the dummy node portion in the next decoding cycle, and accordingly a decoded error due to a erroneous coincidence detection may be prevented.

The advantages and disadvantages of these methods are as follows.

First, the restarting method I has a complex constitution since the trace starting node number and the path selecting signal etc., must be stored. When the $E_s/N_o$ worsens, the effective length of the path memory is shortened, and therefore the BER will worsen. For example, if the coded rate is $\frac{1}{2}$, the constraint length is 7, the 8 levels soft decision is provided, and the physical length of the path memory is 64 stages.

When the $E_s/N_o$ is $-0.5$ dB, the BER becomes $4.7 \times 10^{-3}$. Also, when the effective length of the path memory is 40 stages, the BER becomes $2.5 \times 10^{-3}$.

The restarting method II has the simplest constitution but it does not carry out the path tracing perfectly, and therefore, when the $E_s/N_o$ worsens, the deterioration of the BER becomes relatively large.

The restarting method III has a complex constitution in comparison with the restarting method II and the number of times of tracing is also increased. However, the BER is improved in comparison with the restarting method II.

Figure 14:
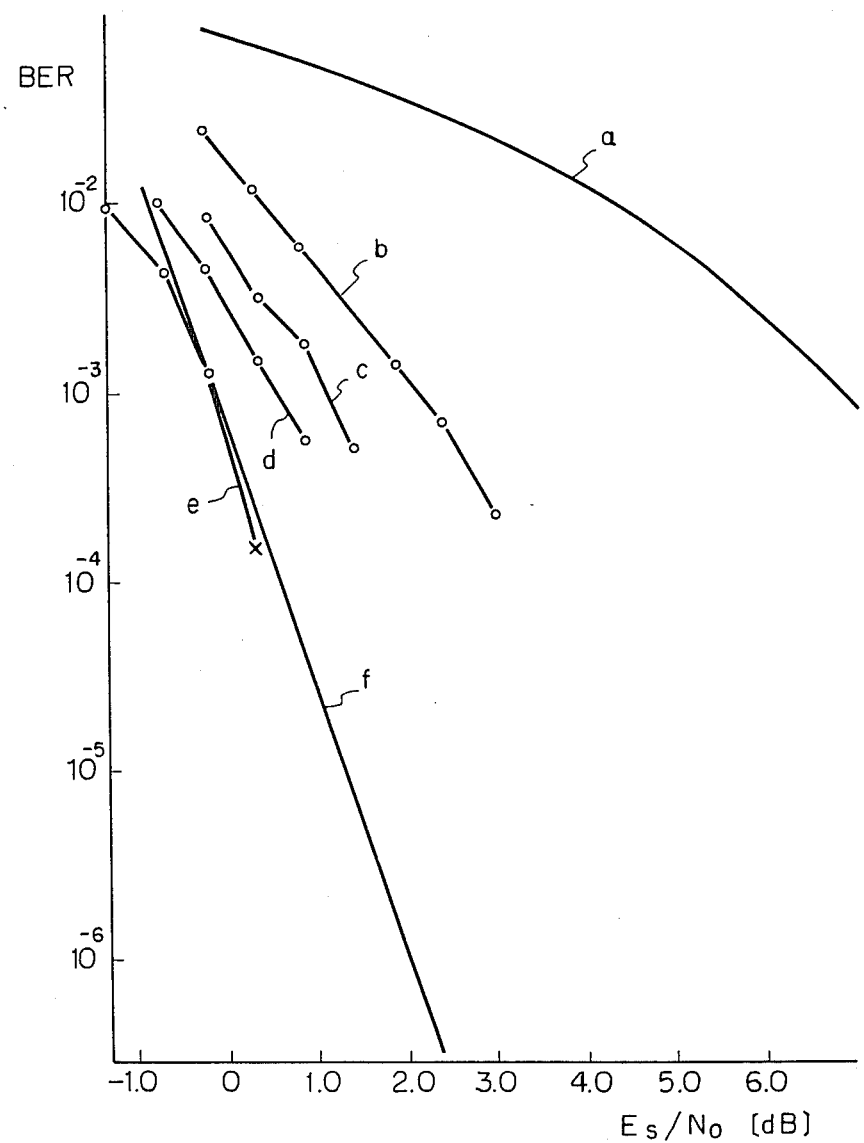
FIGS. 14 to 16 show the characteristic curves for the bit error rate respectively.

FIG. 14 shows a characteristic of the error rate in relation to the restarting method II. The abscissa represents the $E_s/N_o$, and the ordinate represents the BER. This characteristic is obtained under a condition wherein the coded rated is $\frac{1}{2}$, the constraint length is 7, and the physical length of the path memory is 64 stages. In FIG. 14, curve a shows the relationship between the $E_s/N_o$ and the BER with no error correction; curve b shows the relationship between the $E_s/N_o$ and the BER when the average number of times of tracing is 2; curve c, that when the average number of times of tracing is 8; curve d, that when the average number of times of tracing is 16; curve e, that when the average number of times of tracing is 32; and curve f shows a theoretical bit error rate.

Figure 15:
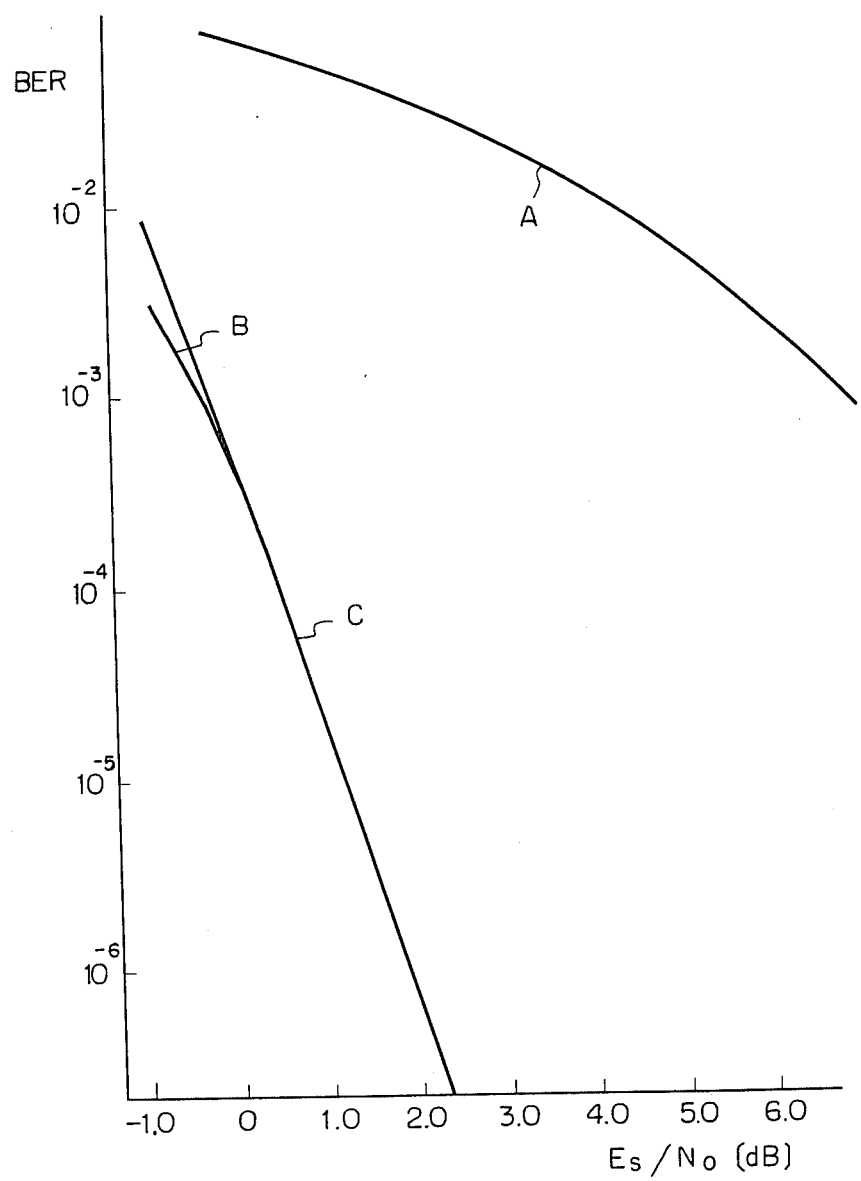

FIG. 15 shows a characteristic of the error rate with relation to the restarting method III. The conditions are the same as those of FIG. 14. In FIG. 15, curve A shows the relationship between the $E_s/N_o$ and the BER with no error correction, as for curve a in FIG. 14. Curve B shows the case where the average number of times of tracing per one decoding cycle is two. Curve C shows the theoretical bit error rate, in the same way as the curve f of FIG. 14. As is clear from FIG. 15, when using the restarting method III, if the average number of times of tracing per one decoding cycle is 2, an error rate characteristic close to the theoretical value may be obtained.

Figure 16:
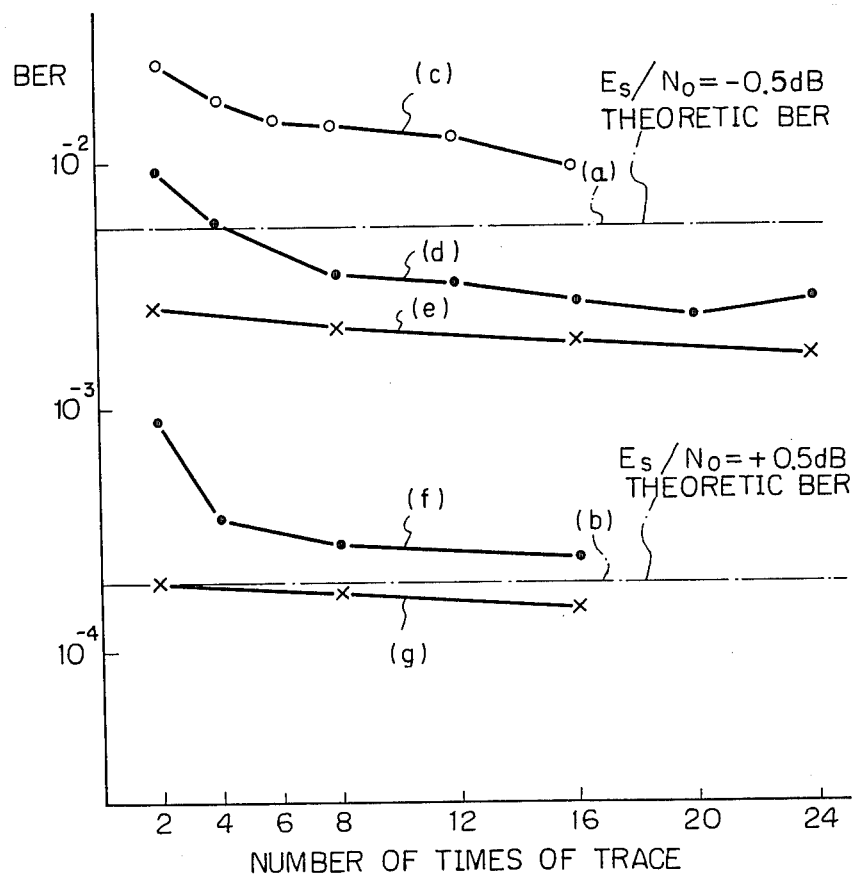

FIG. 16 shows a characteristic of the bit error rate for the average number of times of tracing in relation to the restarting method III under the same conditions as in FIGS. 14 and 15. Curve (a) is the theoretical bit error rate when the $E_s/N_o$ is $-0.5$ dB; curve (b) is the theoretical bit error rate when the $E_s/N_o$ is $+0.5$ dB; curves (c), (d), and (e) are the characteristic curves when the physical lengths of the path memory are 16 stages, 32 stages, and 64 stages respectively; and curves (f) and (g) are characteristic curves when the physical lengths of the path memory are 32 stages and 64 stages respectively. As is apparent from FIG. 16, when the physical length of the path memory is 64 stages, the BER changes only a little, even if the average number of times of tracing increases to more than 2. That is, when the physical length of the path memory is 64 stages, the average number of times of tracing may be set at 2.

Although a preferred embodiment has been described hereinbefore, various modifications and alterations are possible within the scope of the present invention.

Figure 17:
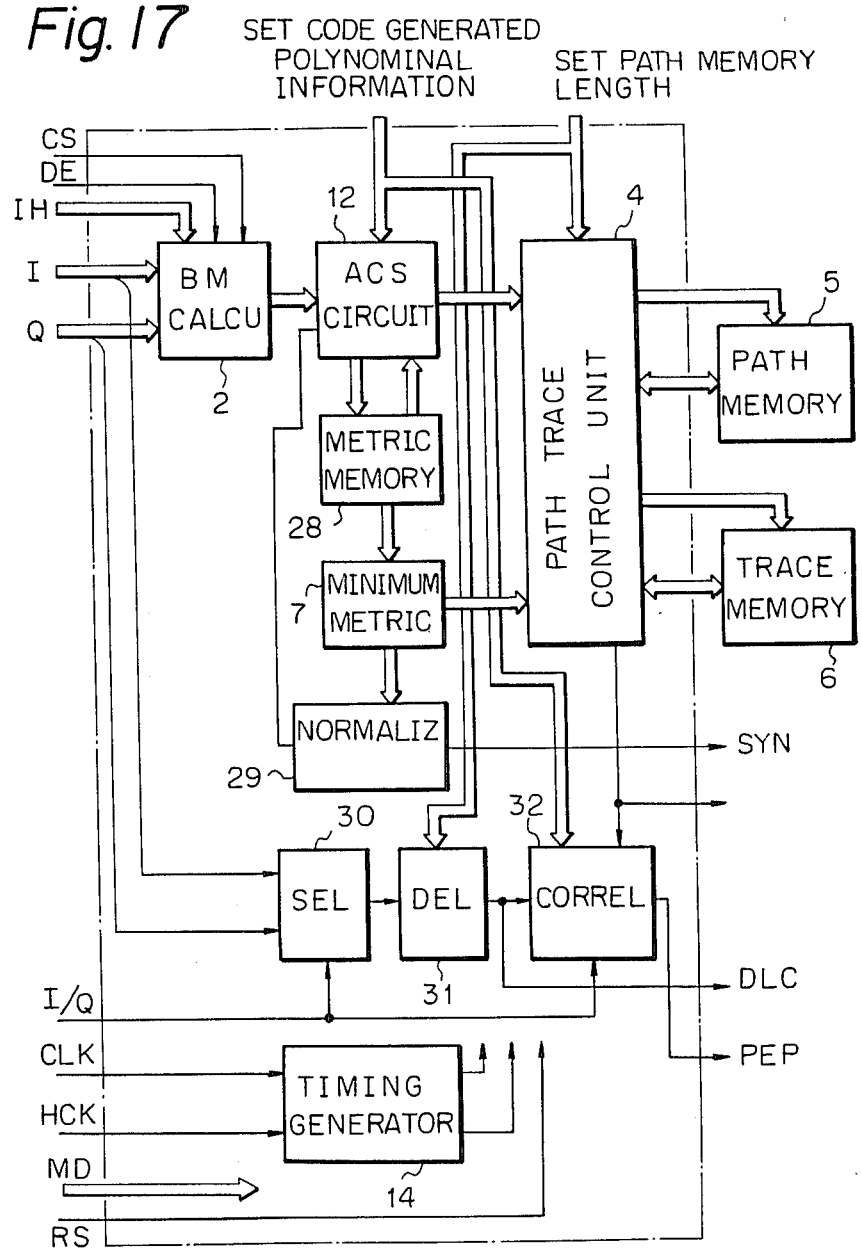
FIG. 17 is a block diagram of the integrated embodiment.

FIG. 17 shows a block diagram for constructing the afore-mentioned embodiment as an integrated circuit. The same reference numbers as in FIG. 6 denote the same parts. In FIG. 17, 12 denotes as ACS circuit; 28, a metric memory; 29, a normalization circuit; 30, a selector; 31, a delay circuit; 32, a re-encoding correlator; CS, a code rule changing signal; DE, a data enable signal; IH, a metric calculation inhibit signal; I and Q, received codes; I/Q, a selecting signal for received codes I and Q; CLK, a data clock pulse; HCK, a fast clock pulse; MD, a mode setting information; RS, a reset signal; SYN, synchronization output information; DLC, a delay code output; and PEP, a pseude error pulse output.

The path memory 5 and the trace memory 6 are constituted by integrated RAM's, and other constitutions within a chained line are formed by one integrated circuit. The normalization circuit 29 normalizes the path metric within a predetermined range, to prevent an overflow when the path metric increases gradually at the adding process etc. The re-encoding correlator 32 re-encodes the decoded signal output from the path trace control unit 4 on the basis of a code generated polynomial setting information, selects one of received codes I and Q by the selector 30 in response to the selecting signal I/Q, and collates this re-encoded signal with that obtained by the selection of one of the received codes I and Q by the selector 30 in accordance with the selecting signal I/Q, which is then delayed by the delay circuit 31 in accordance with a path memory length setting information. If there is a coincidence, there is no error. On the other hand, if there is not a coincidence, the pseudo error pulse PEP is output, whereby the error rate is obtained by counting the pseudo error pulse PEP within a predetermined period.

Figure 18:
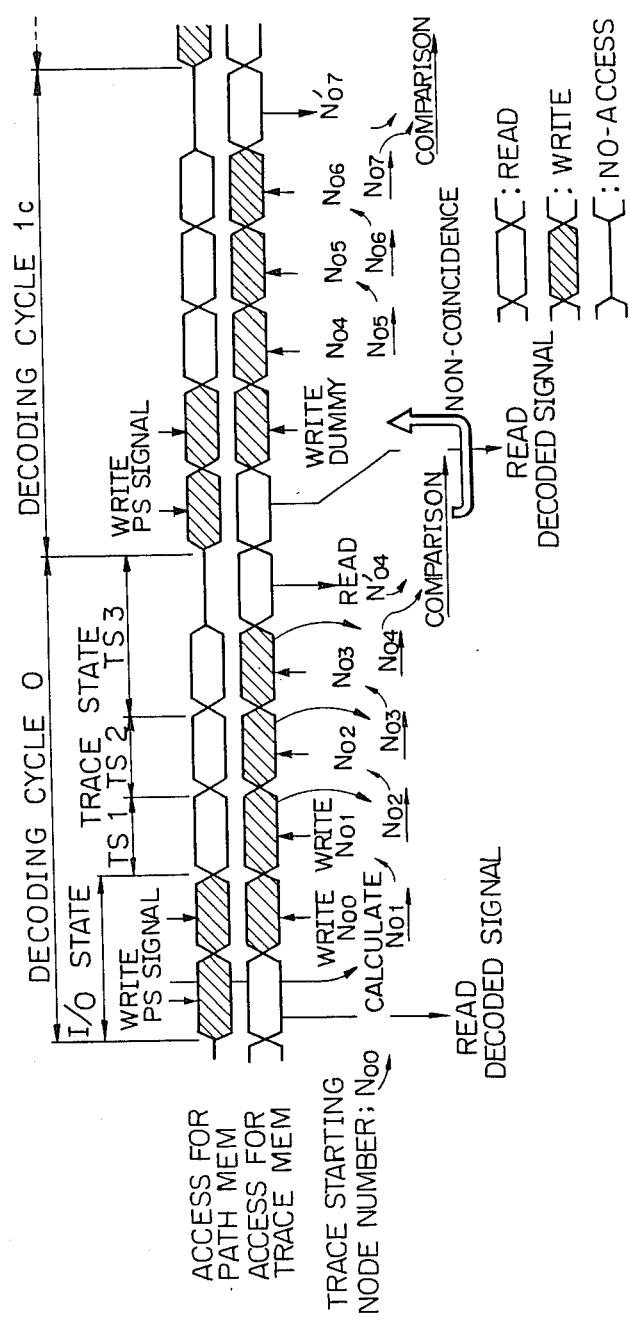
FIGS. 18 and 19 show time charts of the path tracing operation in modified embodiments respectively.

In the afore-mentioned embodiment, the trace memory 6 must be accessed twice for every trace state, that is, the read operation of the previous node number and the write operation of the newly calculated node number. Therefore, assuming that the number of times for accessing the trace memory at the I/O state is $M_{io}$, and the number of trace states per one decoding cycle is $M_t$, the number of times for accessing the trace memory per one decoding cycle is $(M_{io}+2M_t)$. However, if one access per one trace states were sufficient, the decoding rate would by raised. The modified embodiment according to the present invention, which will be described hereinafter, realizes such an operation, i.e., one access per one trace state, to raise the decoding rate. The constitution of this modified embodiment is substantially the same as that shown in FIG. 4. FIG. 18 shows a time chart of the path tracing operation carried out by the modified embodiment. In comparison with the afore-mentioned embodiment, the modified embodiment has three trace states per one decoding state. The operation of the modified embodiment will now be described in detail with reference to FIG. 18.

In FIG. 18, $N_{00}$ denotes the trace starting node number; $N_{01}$, $N_{02}$, and $N_{03}$, node numbers newly calculated by the node number calculator; and $N_{01}'$, $N_{02}'$, and $N_{03}'$, previous contents of the trace memory. At the I/O state of the decoding cycle $\bar{0}$, the path select ing signals obtained by the ACS circuit 3 are written into the path memory 5 twice and the final node number of the most likely path is read out from the trace memory 6 to generate the decoded signal. Then the following node number $N_{01}$ is calculated by the node number calculator 403 on the basis of the node number $N_{00}$ and the path selecting signal, at the same time the node number $N_{00}$ is written into the trace memory 6.

In the following trace state, the node number $N_{01}$ calculated at the I/O state is written into the trace memory 6, and at the same time the path selecting signal corresponding to the node number $N_{01}$ is read out from the path memory 5 to calculate the next node number $N_{02}$. In this case, a read out of the node number $N_{01}'$ from the trace memory 5 and a comparison thereof with the calculated node number $N_{01}$ are not carried out.

The same operation is carried out at the trace states 2 and 3. At the last trace state 3 of the decoding cycle, the write operation of the node number $N_{03}$ to the trace memory 6 and the calculation of the node number $N_{04}$ are carried out, and subsequently, the node number $N_{04}'$ is read out from the trace memory 6 to be compared with the calculated node number $N_{04}$. If the result of the comparison shows a coincidence, a new decoding cycle is started to begin the path tracing. On the other hand, if the result of the comparison does not show a coincidence, the tracing is continued in the following decoding cycle.

When the coincidence is not obtained, in the following continued decoding cycle, the path selecting signal newly obtained by ACS circuit 3 is written into the path memory 5 at the I/O state, and at the same time, the dummy node number is written into the trace memory. Then, the node number $N_{04}$ calculated at the previous decoding cycle is written into the trace memory 6 at the trace state 1, and at the same time, the path selecting signal corresponding to the node number $N_{04}$ is read out from the path memory 5 to calculate the node number $N_{05}$. These read and write operations of the node number are continuously carried out at the following trace states 2 and 3, and the comparison between the node numbers $N_{07}$ and $N_{07}'$ is then carried out only at the final trace state 3 of the decoding cycle.

When the comparison of the node number is carried out only at the final trace state 3 of the decoding cycle, following advantages will be obtained.

(1) The number of times the trace memory is accessed per one decoding cycle becomes $(M_{io}+M_t+1)$. Accordingly, when the number of trace states per one decoding cycle: $M_t$ is large, and the number of times the memory is accessed is almost halved in comparison with the afore-mentioned embodiment, and therefore, the decoding rate is raised.

(2) In the afore-mentioned embodiment, as shown in FIG. 8, there is no time for reading out the node number $N_{03}'$ at the final trace state 2 of the decoding cycle 0, and accordingly the comparison between node numbers $N_{03}$ and $N_{03}'$ can not be carried out the I/O state of the following decoding cycle 1. On the other hand, in the modified embodiment, as shown in FIG. 18, the node number $N_{04}'$ can be read out at the final trace state 3 of the decoding cycle $\bar{0}$, and therefore, a comparison between node numbers $N_{04}$ and $N_{04}'$ can be carried out at the I/O state of the following decoding cycle 1. As a result, the number of tracings may be increased by one in comparison with the afore-mentioned embodiment, and thus the error correction ability may be increased.

Figure 19:
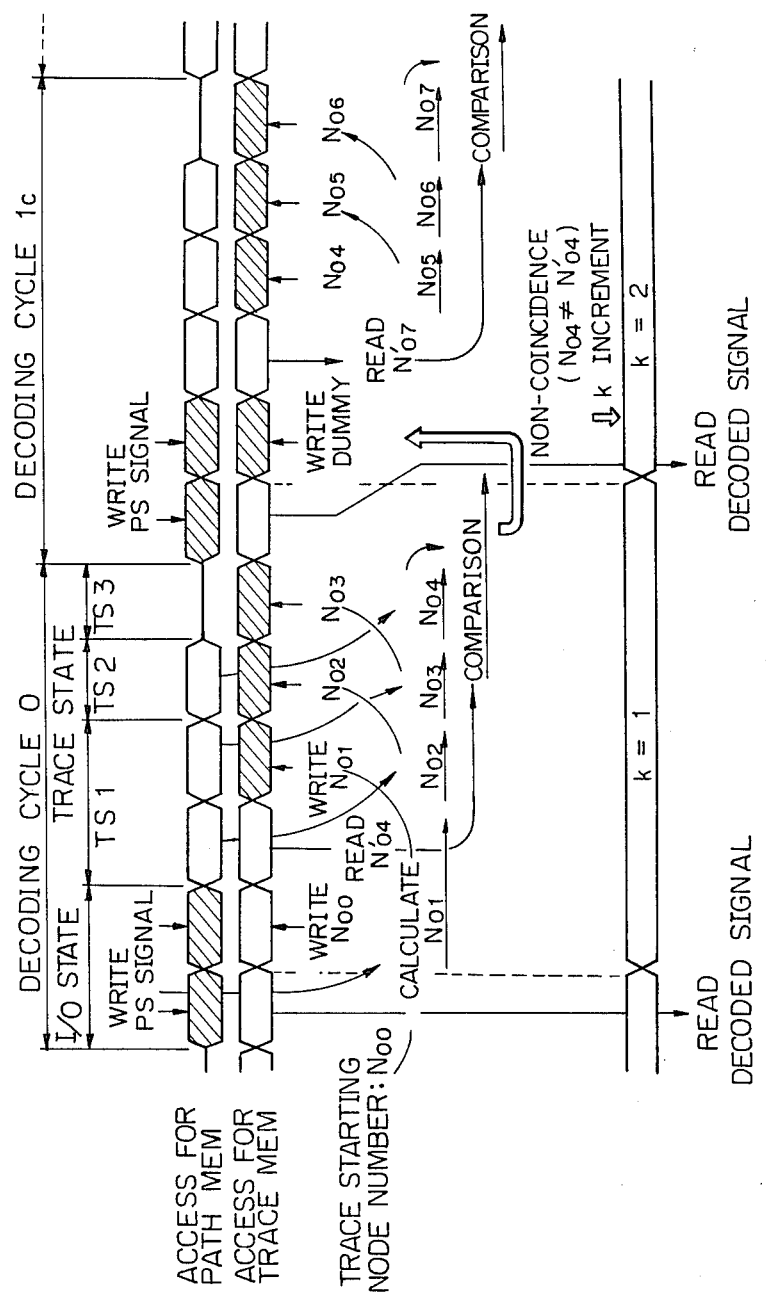

FIG. 19 shows a time chart of the path tracing operation as another modified embodiment. The aforementioned modified embodiment shown in FIG. 18 carried out the read operation of the $(kM_t+1)$th node number $N_{0(kM_t+1)}'$, for example $N_{04}'$, from the trace memory 6 for the comparison, at the final trace state of the decoding cycle. On the other hand, in this modified embodiment shown in FIG. 19, such read operation of the node number $N_{04}'$ is carried out previously at the first trace state of the decoding cycle, and subsequently, at the final trace state, the node number $N_{04}$ is calculated and compared with the node number $N_{04}'$ previously read. Note, in the node number $N_{0(kM_t+1)}'$, k is the number of decoding cycles necessary for tracing one path, and k is 1 in the decoding cycle where the path tracing is newly started, and if the path tracing is not terminated in that decoding cycle, k becomes 2 in the next decoding cycle.

As described above, when the read operation of the node number used for the comparison is carried at the first trace state, the path selecting signal which is used for the calculation of the node number by the node number calculator 403 can be read out form the path memory by one timing clock prior of the calculation. As a result, the whole period of the following trace state can be used for calculating the node number. On the other hand, in afore-mentioned embodiment of FIG. 18, the read operation of the path selecting signal and the calculation of the node number on the basis of the path selecting signal are carried out within the period of the same trace state. As a result, if the time necessary for calculating the node number is the same between FIGS. 18 and 19, the period of the trace state of FIG. 19 may be shortened in comparison with that of FIG. 18, that is, the decoding rate is made faster.

Figure 20:
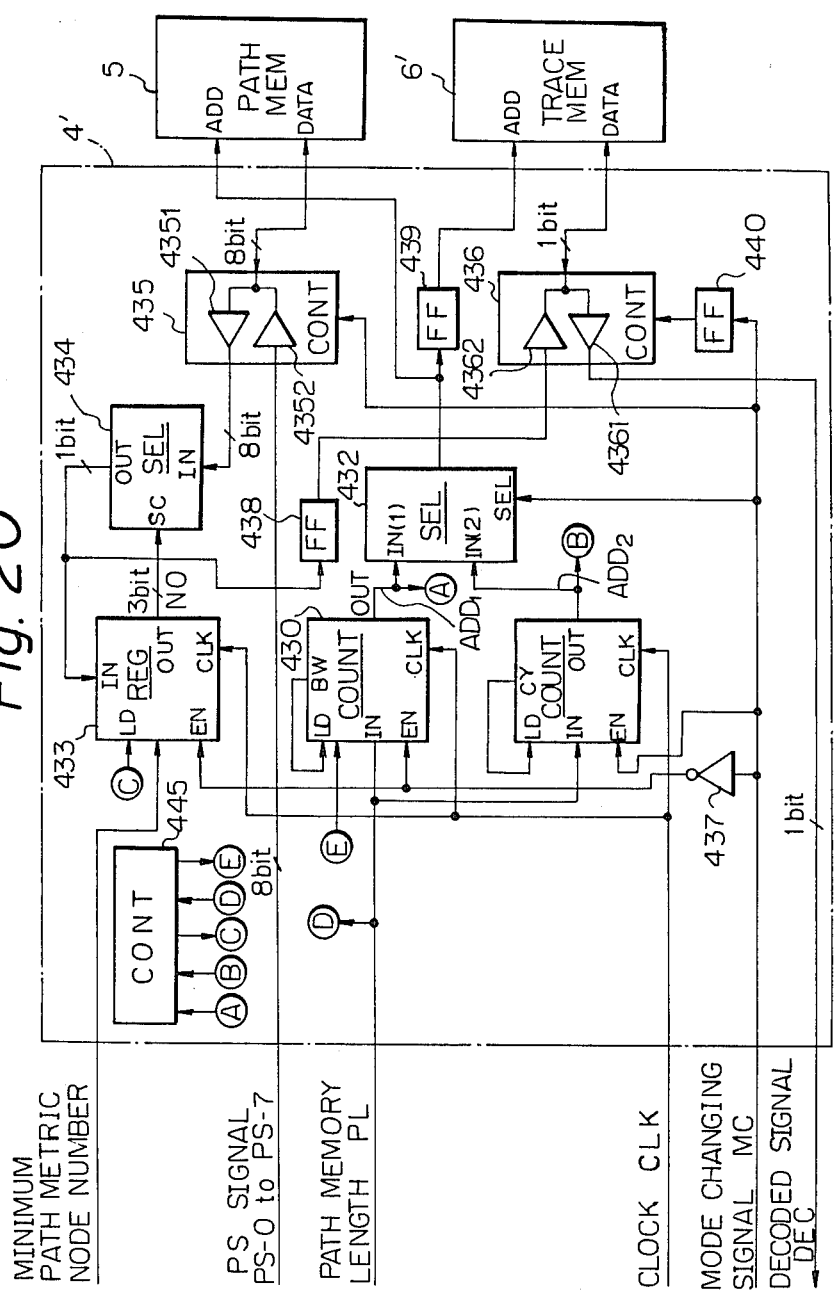
FIG. 20 is a detailed block diagram showing a constitution of the trace control unit as another embodiment of the division type viterbi decoder according to the present invention.

The division type path trace viterbi decoder as a modified embodiment according to the present invention will now be described hereinafter. The schematic constitution is almost the same as that shown in FIG. 4. FIG. 20 shows a detailed constitution of the trace control unit according to this modified embodiment.

In FIG. 20, 430 denotes a trace counter; 431, a I/O counter; 433, a shift register; 432 and 434, selectors; 438, 439, and 440, flip-flops; 435 and 436, buffer circuits; 437, a inverter; 445, a trace control circuit.

The trace counter 430 is a decrement counter for indicating the path tracing position, to which a path memory length signal PL is input so that a maximum count value thereof can be set at the path memory length. A borrow signal BW is input to a load input terminal LD, whereby when the count value decreases gradually and becomes zero, then the count value jumps to the path memory length value. The output of the trace counter 430 is used as an address signal for the path memory 5 and the trace memory 6. That is, the trace counter 430 indicates the address for reading the path selecting signal from the path memory 5 for calculating the node number, and the address for writing the node data of the most likely path, obtained by the calculation of the node number, into the trace memory 6'. An address setting signal is input to this trace counter 430 from the trace control circuit 445, so that the address indicated by the address setting signal can be set as the content of the trace counter 430 in response to an instruction from the trace control circuit 445.

The I/O counter 431 is an increment counter for indicating an address for writing the path selecting signal, and an address for reading the decoded signal, to which the path memory length signal PL is input to that the path memory length is set as the maximum count value thereof. A carry output CY thereof is input to a load input terminal LD, thereby when the count value gradually increases and becomes a maximum value, then the count value jumps to zero. The output of the I/O counter 431 is used as the address for the path memory 5 and the trace memory 6'.

The addressing direction for the path memory 5 and the trace memory 6' by the trace counter 430 is contrary to the addressing direction by the I/O counter 431. As described with reference to FIG. 7, the tracing direction is contrary to the writing direction of the path selecting signal in the path memory 5, and the writing direction of the traced node data is contrary to the reading direction of the decoded signal in the trace memory 6'.

The I/O counter 431 indicates the address for writing the path selecting signal obtained by the ACS circuit 3 and the address for reading the node data used as the decoded signal from the trace memory 6'.

A mode changing signal MC is input to an enable input terminal EN of the trace counter 430 via the inverter 437, and is also input to an enable input terminal EN of the I/O counter 431. These counters 430 and 431 are brought to the enable state when the signal level of the enable input terminal thereof becomes "1".

The address signals $ADD_1$ and $ADD_2$ from the trace counter 430 and the I/O counter 431 are input to input terminals IN(1) and IN(2) of the selector 432 respectively, and at the same time, are input to the trace control circuit 445. The selector 432 selects one of the input signals in response to the mode changing signal MC input to the selection control terminal SEL thereof. That is, the selector 432 selects the address signal $ADD_1$ from the I/O counter 431 when the mode changing signal MC is "1", and the address signal $ADD_2$ from the trace counter 430 when the mode changing signal MC is "0", then sends the selected address signal to the address input terminal of the trace memory 6' via the flip-flop 439, and directly to the address input terminal of the path memory 5. The flip-flop 439 operates as a delay circuit, and delays the accessing of the trace memory 6' by one clock timing in relation to the accessing of the path memory 5 for the same address signal output from the selector 432.

The shift register 433 operates as a calculating circuit for calculating the node number to trace the most likely path, and sends the node number N of 3 bits to the selection control terminal SC of the selector 434, whereby the selector 434 selects one path selecting signal, which comprises one bit, corresponding to the calculated node number from eight path selecting signals input to the selector 434 from the path memory 5. The minimum path metric node number from the node determining circuit 7 is input to this shift register 433, so that the shift register 433 can set the minimum path metric node number as the content thereof in response to the load instruction signal from the trace control circuit 455.

Path selecting signals PS-0 to PS-7 read out from the path memory 5, which correspond to 8 nodes respectively, are input to the input side of the selector 434 via the output buffer 4351. The path selecting signal of one bit selected by the selector 434 is input to a serial input terminal of the shift register 433. The path selecting signals PS-0 to PS-7 from the ACS circuit 3 are input to the data input and output terminal of the path memory 5 via the input buffer 4352.

The output signal of the selector 434 is also input to the data I/O terminal of the trace memory 6' via the flip-flop 438, for generating a one clock timing delay, and the input buffer 4362. The content of the trace memory 6' is read out via the output buffer 4361 to be used as the decoded signal DEC.

The mode changing signal MC is input to the control terminal of the buffer circuit 435, and at the same time, to the control terminal of the buffer circuit 436 via the flip-flop 440 for generating a one clock timing delay. In the buffer circuit 435, when the signal level of the control terminal thereof is "1", the input buffer 4352 is brought to enable state and the output buffer 4351 is brought to the disable state. When the signal level is "0", these states are reversed. Also, in the buffer circuit 436, when the signal level of the control terminal thereof is "1", the output buffer 4361 is brought to the enable state and the input buffer 4362 to the disable state. When the signal level is "0", these states are reversed.

Figure 21:
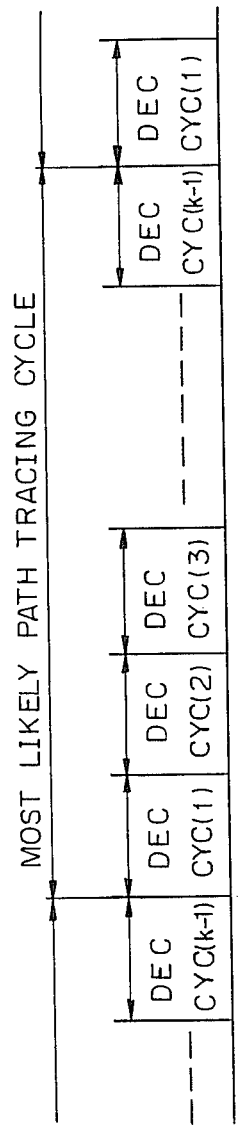
FIG. 21 is a drawing for explaining an outline of a division type path tracing.

The operation of this modified embodiment will be described with reference to FIGS. 21 to 23. FIG. 21 shows the outline of the division type path tracing. The period for tracing one most likely path is divided by k times decoding cycles. In each decoding cycle, the read operation of the decoded signal from the trace memory 6', two times node number calculations, and two times writing operations of the calculated node number to the trace memory 6' are carried out.

The tracing of the most likely path is started from the trace starting node which is the minimum path metric node given by the node determining circuit 7 at the beginning of the most likely path tracing cycle. The tracing of the most likely path over one path history length is completed by carrying out decoding cycles CYC(0) to CYC(k−1). This most likely path tracing cycle is repeated continuously.

Figure 22A:
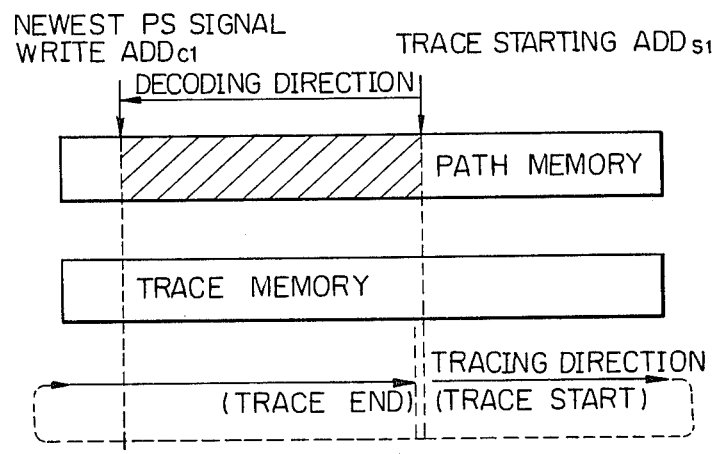
FIGS. 22A and 22B are drawings for explaining the manner of access for the path memory and the trace memory.
Figure 22B:
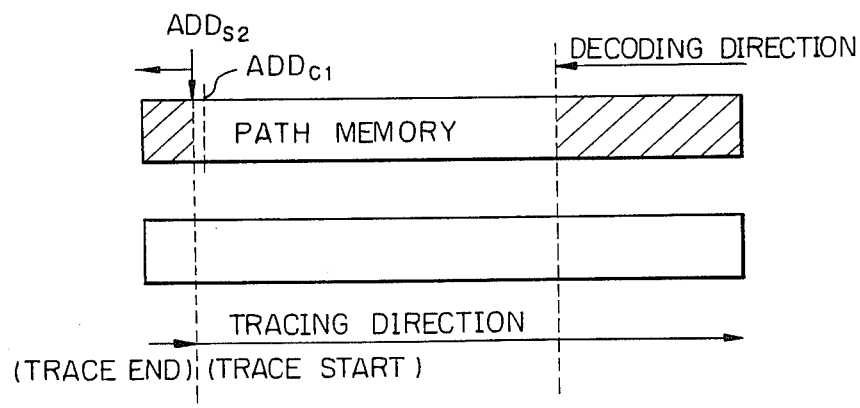
Figure 23:
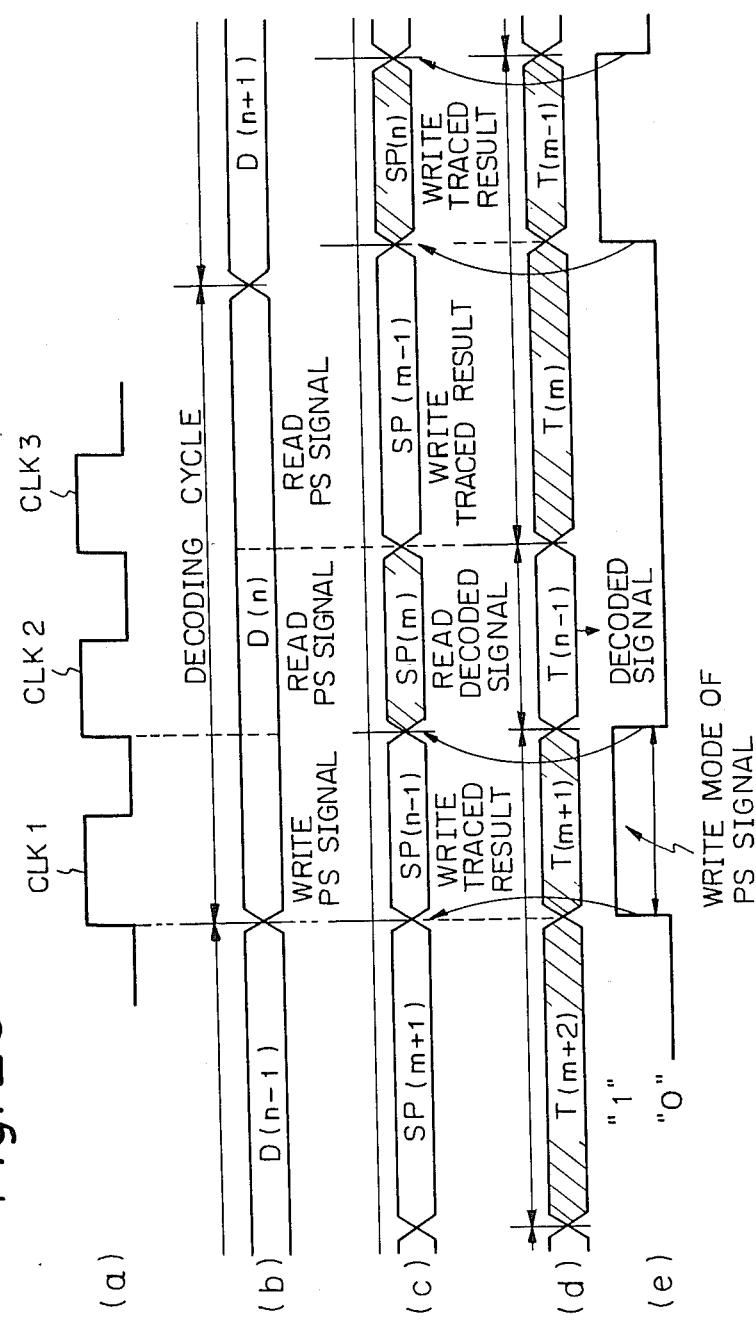
FIG. 23 is a time chart for explaining the operation of the embodiment shown in FIG. 20.

FIGS. 22A and 22B are drawings for explaining the manner of access for the path memory 5 and the trace memory 6'. In FIG. 22A, assuming that the tracing of the most likely path is started from the position of the address $ADD_{S1}$, the read operation of the decoded signal and the write operation of the newest path selecting signal are carried out sequentially for each decoding cycle from the address $ADD_{S1}$ in a counterclockwise direction, and one most likely path tracing cycle is completed at the position of the address $ADD_{C1}$. On the other hand, the read operation of the path selecting signal for calculating the node number and the write operation of the calculated data are carried out from the address $ADD_{S1}$ in a clockwise direction, and the tracing is completed over the address $ADD_{C1}$.

In the following new most likely path tracing cycle, as shown in FIG. 22B, the read operation of the decoded signal is carried out continuously from the address $ADD_{S2}$ subsequent to the address $ADD_{C1}$ where the decoded signal was last read out. On the other hand, the tracing calculation is carried out from this address $ADD_{S2}$ in a clockwise direction. The trace control circuit 445 sets the count value of the trace counter 430 on the basis of the address signal from the I/O counter 431 at the beginning of the path tracing, to realize the above-mentioned addressing. Further, the control circuit 445 detects the completion of the most likely path tracing cycle by storing the address signal from the trace counter 430 at the beginning of the tracing and the path memory length.

The operation of the trace control unit shown in FIG. 20 will be described in detail with reference to FIG. 23. FIG. 23 is a time chart showing the decoding cycle near the read address ADD(n) of the decoded signal and the write address ADD(m) of the traced result. In FIG. 23, (a) represents clock pulses; (b), the received code data D of the soft decision, which gives the path selecting signal PS at the ACS circuit 3; (c), the read-write timing of the path selecting signal for the path memory 5; (d), the read-write timing of the traced result from the trace memory 6'; and (e), the mode changing signal MC. In response to this mode changing signal MC, the trace control unit 4' is set at either a first mode in which the write operation of the path selecting signal and the read operation of the decoded signal are carried out or at a second mode in which the most likely path is traced.

First, the first mode in which the write operation of the path selecting signal to the path memory 5 and the read operation of the decoded signal DEC from the trace memory 6' are carried out will be explained. Here, it is assumed that the path selecting signal and the traced result data are already stored in the path memory 5 and the trace memory 6' by the previous signal process.

The first mode is established by setting the mode changing signal MC at the "1" level during one clock period in response to the clock $CLK_1$, whereby the trace counter 430 and the shift register 433 are set at the disable state, and the selector 432 selects the address signal $ADD(n-1)_1$ to be output from the I/O counter 431. The path selecting signal PS(n−1) obtained from the data D(n−1) is input to the path memory 5 via the input buffer 4352, and is written to the address indicated by the address signal $ADD(n-1)_1$.

On the other hand, the address signal $ADD(n-1)_1$ is also input to the address terminal of the trace memory 6' via the flip-flop 439, so that the traced result data is read from the position indicated by the address signal $ADD(n-1)_1$ of the trace memory 6' via the output buffer 4361 at the timing of the following clock $CLK_2$. This traced result data corresponds to the final level node data of the most likely path, and accordingly, the decoded signal DEC is obtained from this data.

As described above, the content read from the address of the trace memory 6', which corresponds to the address of the path memory 5 to which the path selecting signal PS(n−1), i.e., $ADD(n-1)_1$, is written, is the final level node data of the most likely path.

The second mode in which the tracing of the most likely path is carried out is established by setting the mode changing signal MC at the "0" level at the timing of the clock $CLK_2$, whereby the trace counter 430 and the shift register 433 is set at the enable state; the I/O counter, at the disable state; and the selector selects the address signal $ADD(m)_2$ from the trace counter 430 to be output to the path memory 5 and the trace memory 6'.

Path selecting signals PS(m) of 8 bits, each bit corresponding to each node, is read from the address position of the path memory 5 indicated by the address signal $ADD(m)_2$ and sent to the selector 434 via the output buffer 4351. The selector 434 selects one of the path selecting signals PS(m) of 8 bits in response to the node number signal from the shift register 433. This selected path selecting signal of 1 bit corresponds to the node indicated by the node number signal from the shift register 433 as the surviving node, and is input to the serial input terminal of the shift register 433, and at the same time, to the trace memory 6' via the flip-flop 438.

The path select signal output from the selector 434 is added to the register content (node number) of the shift register 433 as the MSB thereof. It is apparent from the explanation regarding FIG. 2, that the node number $N_{01}$ is obtained by adding the path selecting signal $PS_{00}$ to the node number $N_{00}$ represented by the binary notation as the MSB and shifting the node number $N_{00}$ toward the LSB side to eliminate the LSB thereof. Accordingly, the above-mentioned operation realizes the calculation of the node number according to the above-mentioned expression (1). The node number signal calculated by the shift register 433 as described above is again sent to the selector 434, whereby the selector 434 can select the following path selecting signal corresponding to that calculated node number.

On the other hand, the path selecting signal selected by the selector 434 as the traced result data is sent to the trace memory 6' by the flip-flop 438. Accordingly, that traced result data is written to the trace memory 6' at the timing of the next clock $CLK_3$, due to the delay operation of flip-flops 438 and 440.

The content of the trace counter 430 is updated in response to the next clock $CLK_3$ so that the address signal thereof becomes ADD(m−1), whereby path selecting signals are read from the address ADD(m−1) of the path memory 5 and the above-described operation is repeated.

As described above, the trace calculation of the node number is carried out two times for one decoding cycle in the second mode. The number of times of trace calculation in one decoding cycle can be changed by changing the cycle of the mode changing sgnal MC.

Figure 24:
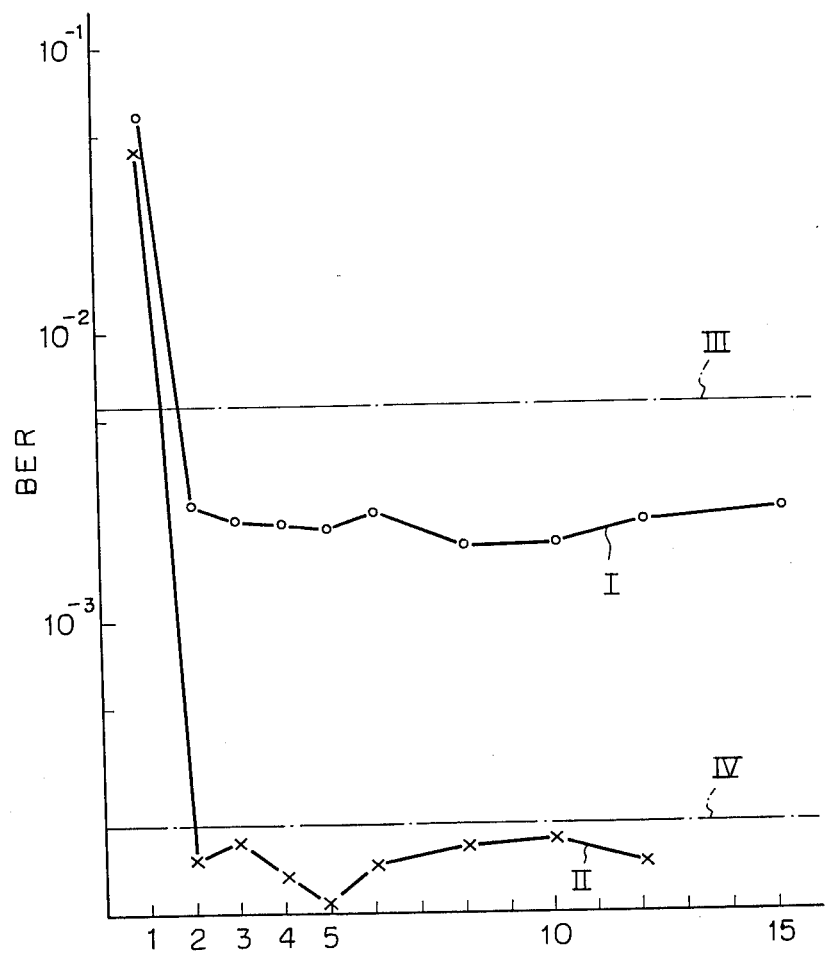
FIG. 24 shows characteristic curves of the bit error rate of the embodiment.

FIG. 24 shows characteristic curves of the bit error rate (BER). In FIG. 24, an abscissa represents the number of times of tracing; and an ordinate, the BER. Curve I is a characteristic curve obtained when the $E_s/N_o$ is −0.5 dB. Curve II is a characteristic curve obtained when the $E_s/N_o$ is +0.5 dB. Note, a straight line III is a theoretical bit error rate when the $E_s/N_o$ is −0.5 dB, and a straight line IV is a theoretical bit error rate when the $E_s/N_o$ is +0.5 dB.

As apparent from these curves, if the number of times of tracing is more than two, the bit error rate becomes lower than the theoretical value. Note, even if the number of times of tracing increases, the change in the bit error rate is only slight.

Figure 25:
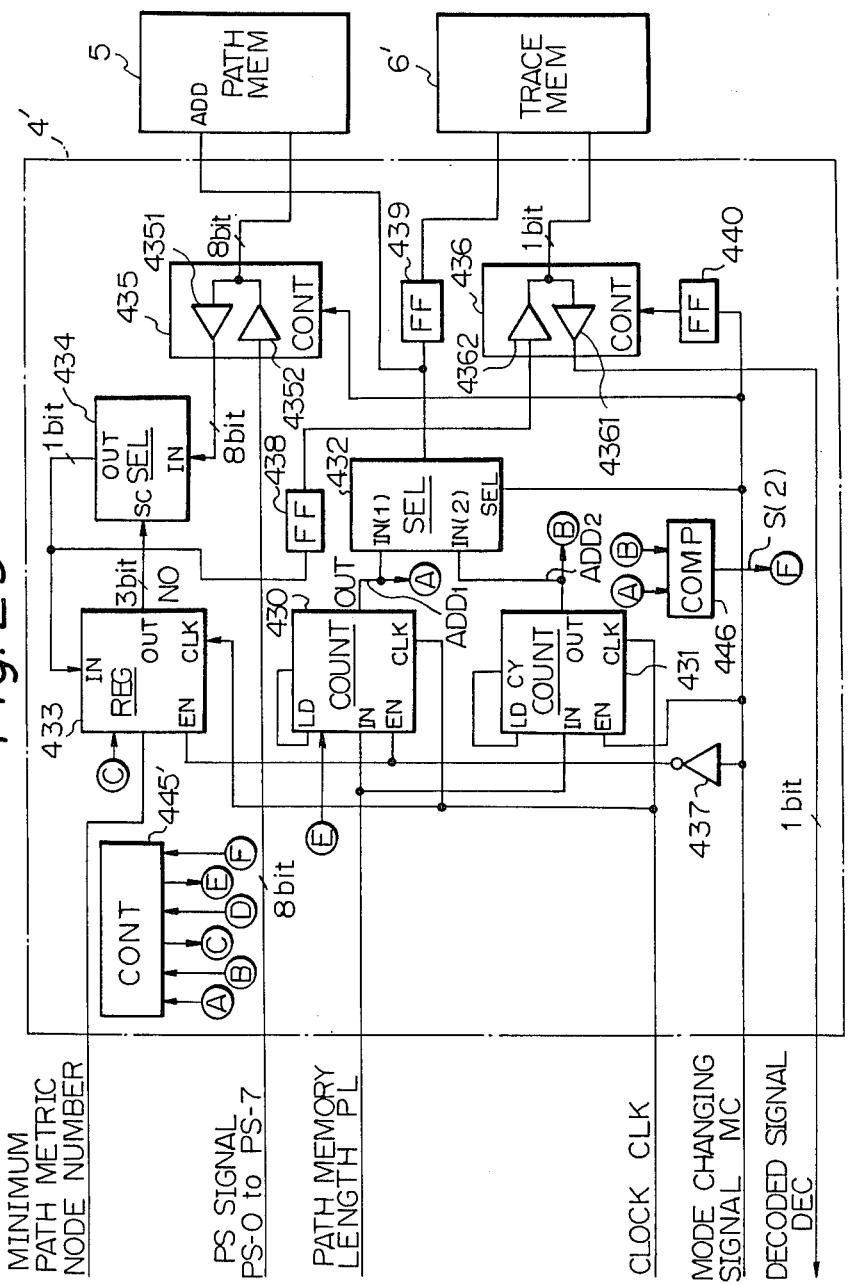
FIG. 25 is a block diagram showing a further embodiment of the division type viterbi decoder.

FIG. 25 shows another modified embodiment of the division type path trace viterbi decoder. In the embodiment described in FIG. 20, as apparent from FIG. 22A, when the tracing of one most likely path is completed, the address for reading the final decoded signal from the trace memory is $ADD_{C1}$, and the write operation of the traced result to the trace memory is carried out at the portion beyond the address $ADD_{C1}$ in the clockwise direction.

On the other hand, when the following most likely path is traced, the address for reading the decoding signal from the trace memory is the address $ADD_{S2}$ next to $ADD_{C1}$, and as shown in FIG. 22B, the write operation of the traced result to the trace memory is carried out from this address $ADD_{S2}$ in the clockwise direction. As a result, the data of traced result written at the righthand portion from the address $ADD_{C1}$ by the tracing of the previous most likely path is rewritten by the data obtained by the tracing of the current most likely path, without being used. Therefore, the write operation at this portion is unnecessary, and time-consuming, and the decoding rate is reduced.

The path trace control unit shown in FIG. 25 is provided for solving this problem. The difference from FIG. 20 is that this embodiment comprises a comparator 446 for comparing the address signal $ADD_1$ from the trace counter 430 and the address signal $ADD_2$ from the I/O counter 431, to detect a coincidence thereof. The coincidence signal S(2) from the comparator 446 is sent to the trace control circuit 445'.

Figure 26A:
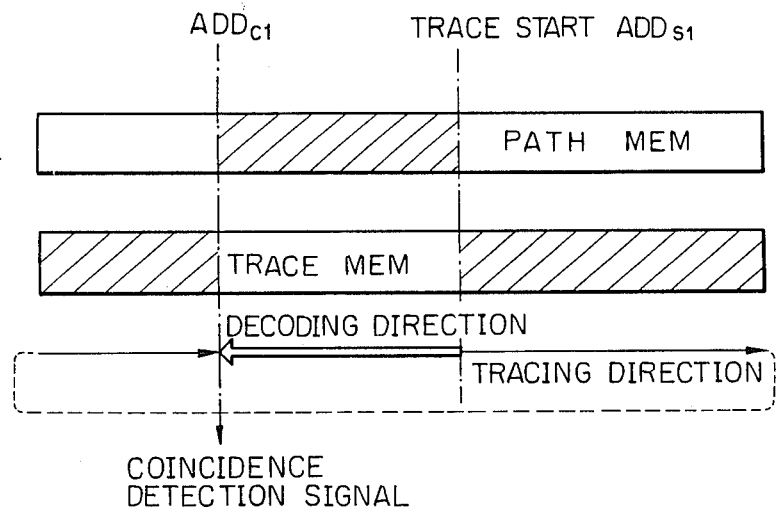
FIGS. 26A and 26B are drawings for explaining the operation of the embodiment shown in FIG. 25.
Figure 26B:
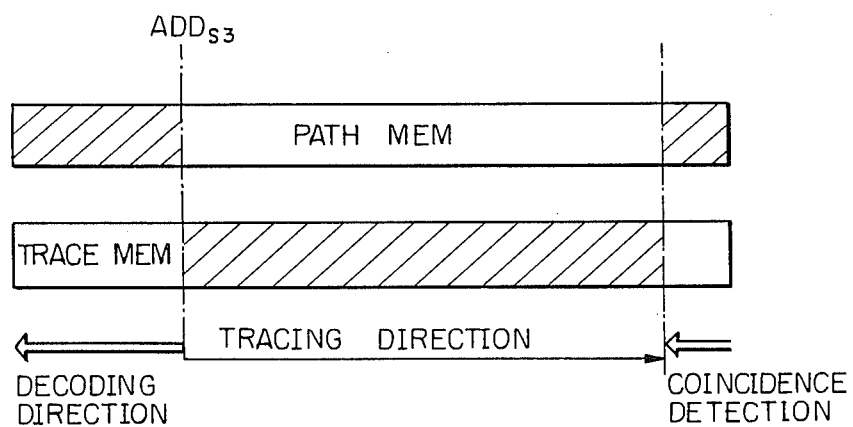

When the comparator 446 detects a coincidence between the address for reading the decoded signal from the trace memory in the counterclockwise direction, i.e., the address signal from the I/O counter 431, and the address for writing the traced result, i.e., the address signal from the trace counter 430, the coincidence signal S(2) is sent to the trace control circuit 445', and thus the control circuit 445' terminates the tracing of the most likely path, and then changes the content of the trace counter 430 on the basis of the address signal from the I/O counter 431 to start the tracing of the following most likely path from the address $ADD_{S3}$ next to the $ADD_{C1}$, as shown in FIGS. 26A and 26B. Accordingly, an unnecessary write operation of the traced result to the trace memory is prevented.

Figure 27:
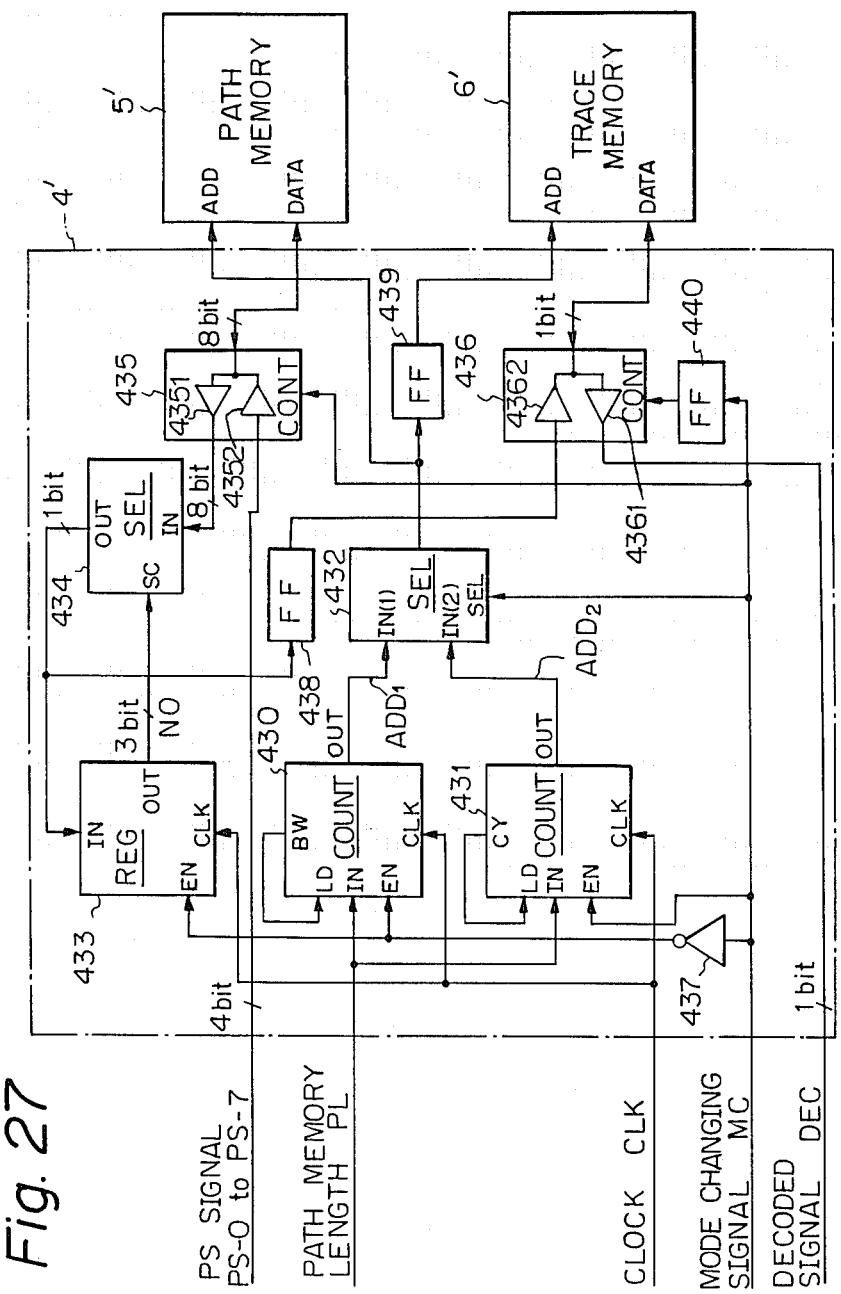
FIGS. 27 and 28 are block diagrams of further embodiments of the division type viterbi decoder.

FIG. 27 shows another embodiment of the division type viterbi decoder. In the embodiment shown in FIG. 20, when the most likely path is traced, the minimum path metric node is chosen as the trace starting node. However, it is not always necessary to start the tracing from the minimum path metric node as the trace starting node. That is, if the path history length, i.e., the path memory length, is long enough, the most likely path can be obtained by starting the tracing from any node.

The embodiment shown in FIG. 27 simplifies the circuit in accordance with the above-mentioned viewpoint. In this embodiment, the minimum path metric determining circuit 7 is not necessary, and therefore, the minimum path matric node number is not input to the shift register 433. Further, the trace control circuit 445 is also not necessary. The path memory 5' has a long enough length in comparison with that of FIG. 20.

The read operation of the decoded signal from the trace memory 6' is carried out in the counterclockwise direction, on the other hand, the write operation of the traced result to the trace memory 6' is carried out in the clockwise direction, and these read and write operations are not correlated. As a result, when the tracing of new most likely path starts, the tracing starts from the node at which the previous most likely path finally arrives. In this case, the tracing does not always start from the minimum path metric node, since the previous most likely path is not correlated with the current most likely path. However, the error correction ability is not affected, since the length of the path memory is sufficient to ensure that the most likely path has the same route at the final level side. As described above, the minimum path metric node determining circuit is not necessary. Further the timing generating circuit, etc., may be simplified, since it is not necessary to detect the head portion of the most likely path during the tracing.

Figure 28:
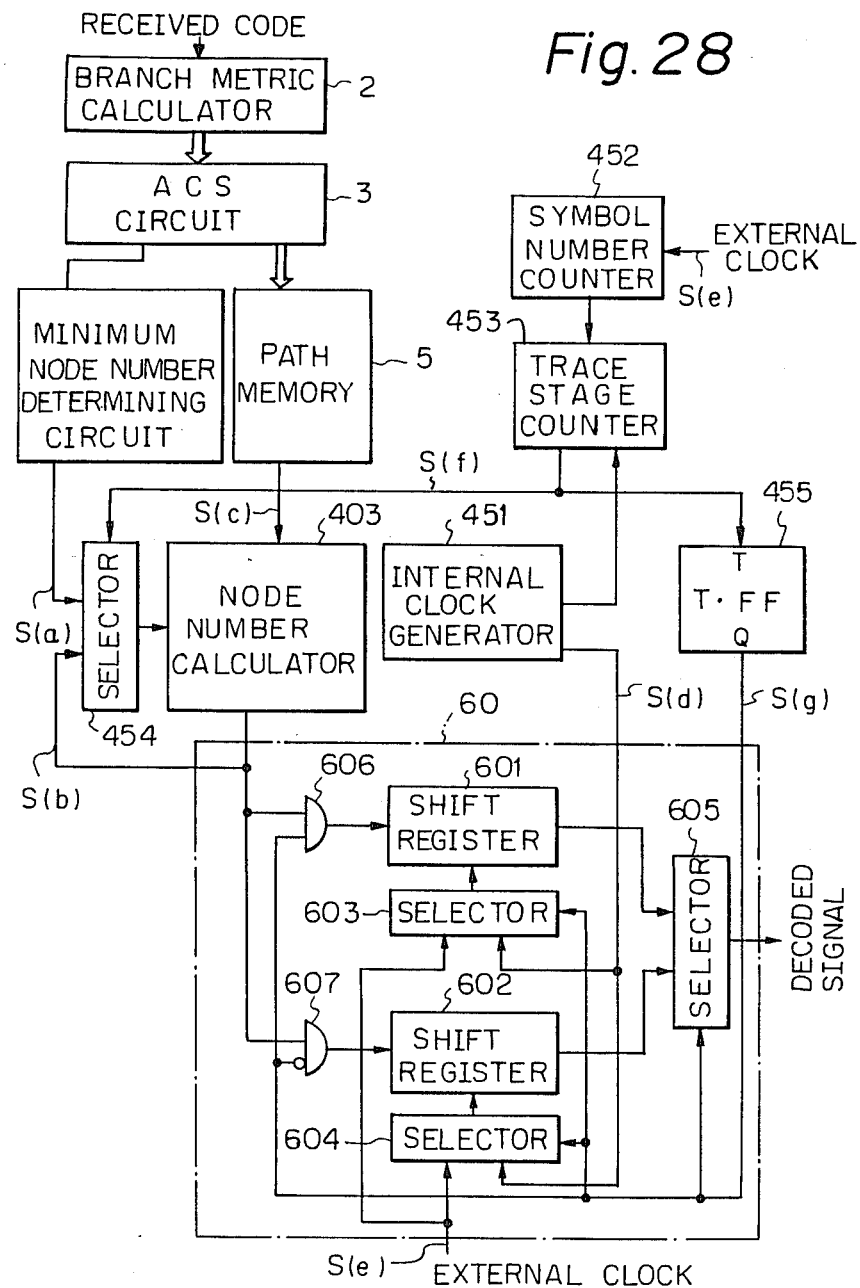

FIG. 28 shows a further embodiment of the division type viterbi decoder. In the division type path tracing system, a plurality of times of decoding, for example n times, are carried out during the period in which one most likely path is traced. Accordingly, the node data used for reading the decoded signal is the data from the final level node to the n level in the reverse direction of the path. Therefore, it is necessary to store the data of these n nodes in the trace memory, but it is not necessary to store other node data. Accordingly, the length of the trace memory is sufficient to ensure that the data is stored from the final level node to the n level node, and thus the length of the trace memory may be shortened.

In FIG. 28, 2 denotes the branch metric calculator; 3, the ACS circuit; 5, the path memory; 7, the minimum path metric node determining circuit; 403, the node number calculator; 451, an internal clock generator; 452, a symbol number counter; 453, a trace level number counter; 454, a selector; 455, a T-flip-flop; 60, a trace memory portion. The trace memory portion 60 comprises n-stages shift registers 601 and 602, selectors 603, 604 and 605, and gate circuits 606 and 607. The number of stages of the shift register, i.e., n stages, corresponds to the n levels of the most likely path at the final level node side, instead of the whole length of the most likely path. Here, the number n is the number of times decoding is carried out during the period for tracing one most likely path.

The operation of this embodiment will be now described. The internal clock generator 451 generates clock pulses for reading the decoded signal having the decoding cycle period to send this signal to the selectors 603 and 604. Clock pulses having the trace calculation cycle are input to the other inoput terminals of the selectors 603 and 604. These clock pulses are supplied to the shift registers 601 and 602 as a shift timing clock pulse.

While, during the number of times of tracing in the period in which one most likely path is traced, the counter 453 is, for example, 120, and outputs a signal S(f) every time a tracing of 120 levels of a path is completed. This signal S(f) is added to the selector 454 and the T-flip-flop 455, and accordingly, the selector 454 selects the path trace starting node number S(a) from the minimum path metric node determining circuit 7 only at the time of starting the path tracing. When the trace starting node number is $N_{00}$, the node number calculator 403 calculates the following node number $N_{01}$ according to the afore-mentioned expression (1). Subsequently, the selector 454 selects the node number data S(b) from the node number calculator 403. Accordingly, the node number is calculated by the node number calculator 403 on the basis of the previous node number and the path selecting signal corresponding to that previous node number in sequence, until the tracing arrives at the final level node of the most likely path.

The T-flip-flop 455 iverts the level of the output signal S(g) from the output terminal Q thereof at every reception of the output signal S(f) from the counter 453. When the output signal S(g) of the T-flip-flop is "1" level, the gate circuit 606 is opened, the gate circuit 607 is closed, the selector 603 selects the external clock pulse S(e), the selector 604 selects the internal clock pulse S(d), and the selector 605 selects the output signal from the shift register 602 as the decoded signal to be output. Therefore, the node number data S(b) from the node number calculator 403 is input to the shift register 601 via the gate circuit 606 and shifted therein in sequence. This shift register 601 stores the node data from the final level node to the n level node of the most likely path at the time of completion of the most likely path, since the number of stages of the shift register is n.

On the other hand, the node data of n stages of the previous most likely path is already stored in the shift register 602. This node data is sequentially read from the final level node in the reverse direction at the timing of the decoder cycle according the internal cycle pulse S(d), and then is output as the decoded signal via the selector 605.

When the output signal S(g) of the T-flip-flop 455 becomes "0" in the following path trace cycle, the operation modes of the shift registers 601 and 602 are inverted, so that the node number data is written to the shift register 602 via the gate circuit 607, and the node number data used for the decoding is read from the shift register 601 via the selector 605.

Note that, the trace memory portion 60 may be constituted by a small capacity RAM or D-flip-flops capable of high speed operation, instead of the shift registers.

Figure 29:
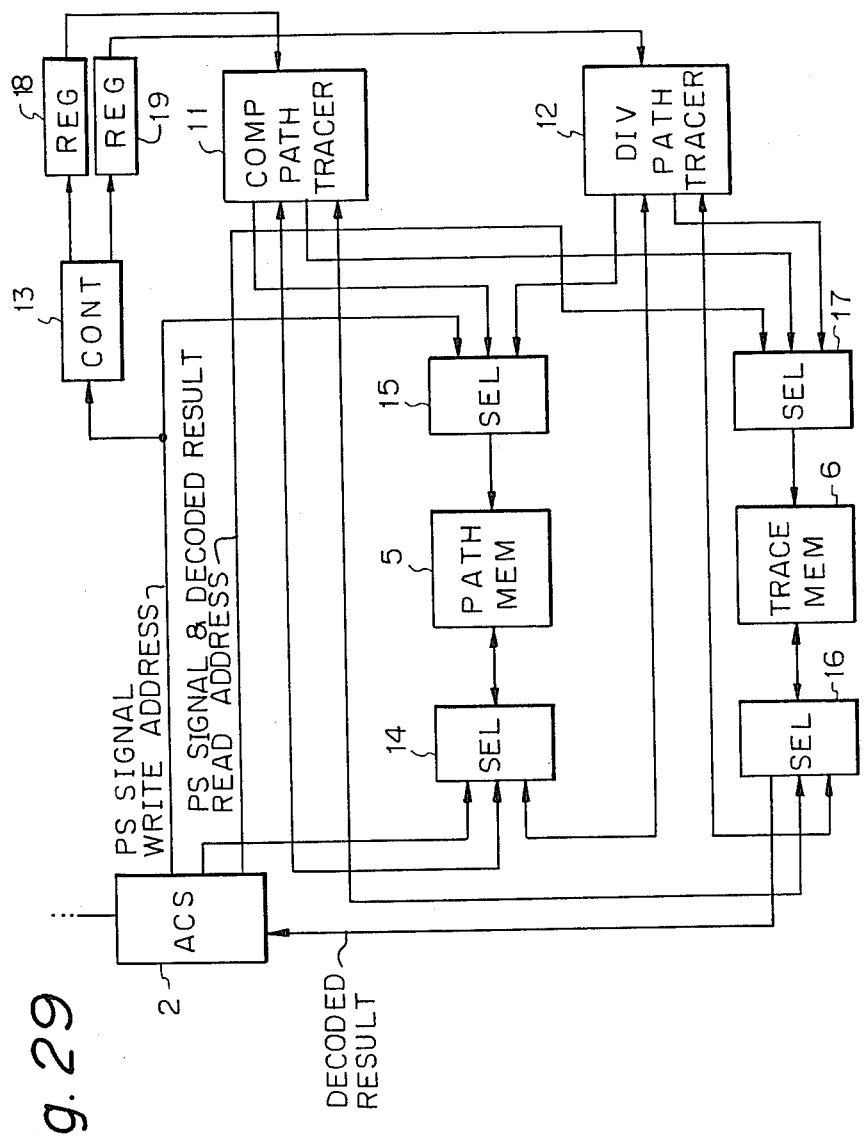
FIG. 29 is a block diagram of another embodiment of the coincidence comparing type viterbi decoder; and, FIG. 30 is a drawing for explaining the operation of the embodiment shown in FIG. 29.

FIG. 29 shows further embodiments of the coincidence comparing type viterbi decoder. In the first embodiment shown in FIG. 6, which uses the restarting method III, when a plurality of decoding cycles are continued, the dummy node number is written into the trace memory during that time. When the tracing of the following new most likely path is started, even if a coincidence comparison is carried out at the dummy node portion, a coincidence is never obtained. Therefore, the comparing operation at this portion is unnecessary. The comparing operation, the node number must be read, which lengthens the period of the decoding cycle and lowers the decoding rate.

On the other hand, it is sufficient only to write the calculated node number at the portion in which the dummy node numbers are written, in the following path tracing cycle. For this purpose, the division type viterbi decoder described above may be used. The embodiment of FIG. 29 realizes the above-mentioned operation.

In FIG. 29, 2 denotes the ACS circuit; 11, a coincidence comparing type path tracer; 12, a division type path tracer; 13 a controller; 14 and 16, data selectors; 15 and 17, address selectors; and 18 and 19, registers.

Figure 30:
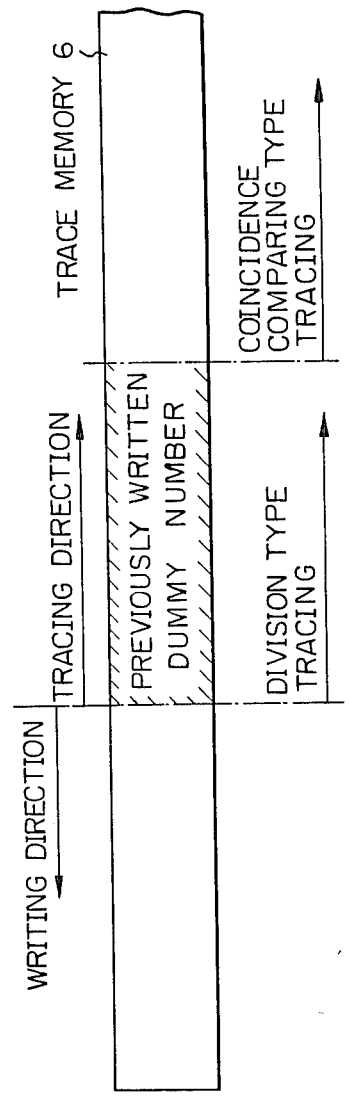

The operation of this embodiment will described with reference to FIG. 30. As shown in FIG. 30, the division type path tracing method is carried out by the division path tracer 12 at the portion in which the dummy node number is written, i.e., the portion from the trace starting address of the previous most likely path to the trace starting address of the new most likely path, and subsequently, the coincidence comparing type path tracing method is carried out by the coincidence comparing type path tracer 11. This changing between the division path tracing and the coincidence comparing path tracing is controlled by the controller 13, therefore the controller 13 stores the trace starting address of the previous most likely path.

In the afore-mentioned embodiments of the coincidence comparing type viterbi decoder, the LSB (Least Significant Bit) of the final level node of the most likely path represented by the binary notation is used as the decoded signal. However, the MSB (Most Significant Bit) thereof also may be used as the decoded signal. Assuming that the node number has k digits, the LSB of the final level node number corresponds to the MSB of (k−1) levels prior to the final level node. Accordingly, if the MSB of the final level node is used as the decoded signal, the number of times that the memory must be accessed is reduced in order to obtain the same decoded signal, in comparison with the case wherein the LSB is used, and therefore, a fast operation becomes possible. In other words, when the MSB is used as the decoded signal, if the number of times of access to the path memory is the same as when the LSB is used, the length of the path memory appears to be long, i.e., the effective length of the path memory becomes longer than the physical length thereof, and thus the increment of the error rate due to the termination of the path tracing is reduced.

We claim:

1. A Viterbi decoder for decoding a received signal, and having a plurality of nodes, each corresponding to a state of said decoder, comprising:
   branch metric calculator means for calculating branch metrics for each of the nodes on the basis of the received signal;
   path metric calculator means for calculating path metrics on the basis of said branch metrics;
   path selecting means for selecting a surviving path metric for each of the nodes on the basis of said path metrics and for providing path selecting signals indicating the surviving paths;
   path memory means for storing said path selecting signals generated by said path selecting means for each of the nodes;
   node calculator means for determining a node of a most likely path based on one of said path selecting signals and a previously determined node;
   trace memory means for storing said nodes, corresponding to the most likely path data, generated by said node calculator means; and
   means for providing a decoded signal on the basis of the nodes stored in said trace memory means corresponding to the most likely path data.

2. A Viterbi decoder in accordance with claim 1, wherein said nodes are represented by a binary code and said means for providing includes means for generating said decoded signal in accordance with a most significant bit of one of said nodes.

3. A Viterbi decoder for decoding a received signal, and having a plurality of modes, each corresponding to a state of said decoder, comprising:
   branch metric calculator means for calculating branch metrics of each of the nodes on the basis of the received signal;
   path metric calculator means for calculating path metrics on the basis of said branch metrics;
   path selecting means for selecting a surviving path metric for each of the nodes on the basis of said path metrics and for providing path selecting signals indicating the surviving paths;
   path memory means for storing said path selecting signals generated by said path selecting means for each of the nodes;
   node calculator means for determining a node of a most likely path having a path history length based on one of said path selecting signals and a previously determined node;

trace memory means for storing said nodes, corresponding to the most likely path data, generated by said node calculator means for the path history length; and coincidence comparator means for comparing a node determined by said node calculator means with a node stored in said trace memory means and for detecting coincidence therebetween;

means for inhibiting operation of said node calculator means in response to detection of coincidence by said coincidence comparator means to start the tracing of the new most likely path and for storing a node calculated by said node calculator means in said trace memory means; and means for providing a decoded signal on the basis of the nodes stored in said trace memory means.

4. A Viterbi decoder having decoding cycles for decoding a received signal, and having a plurality of modes, each corresponding to a state of said decoder, comprising:

branch metric calculator means for calculating branch metrics for each of the nodes on the basis of the received signal;

path metric calculator means for calculating path metrics on the basis of said branch metrics;

a path selecting means for selecting a surviving path metric for each of the nodes on the basis of said path metrics and for providing path selecting signals indicating the surviving paths;

path memory means for storing said path selecting signals generated by said path selecting means for each of the nodes;

node calculator means for determining a node of a most likely path having a path history length based on one of said path selecting signals and a previously determined node;

trace memory means for storing said nodes, corresponding to the most likely path data, generated by said node calculator means for the path history length;

coincidence comparator means for comparing a node determined by said node calculator means with a node stored in said trace memory means and for detecting coincidence therebetween;

means for providing a decoded signal on the basis of nodes, corresponding to the most likely path, stored in said trace memory means;

storing means for storing a given node in said trace memory means, when no coincidence is detected within one of the decoding cycles; and means for halting said decoding when coincidence is detected by said coincidence comparator means within one of the decoding cycles, and for continuing said decoding in another decoding cycle when coincidence is not detected.

5. A Viterbi decoder in accordance with claim 4, wherein:

the decoding cycles each comprise an input-output stage and a plurality of trace states, wherein said means for providing a decoded signal includes reading means for reading node data from said trace memory means during the input-output state, wherein said means for storing a given node includes a means for storing the given node during the input-output state, and wherein said trace memory means includes means for storing the node data calculated by the node calculator means in each of the trace states.

6. A Viterbi decoder in accordance with claim 5, wherein said coincidence comparator means carries out said comparison for detecting coincidence in each of the trace states in a decoding cycle.

7. A Viterbi decoder in accordance with claim 5, wherein said coincidence comparator means carries out said comparison for detecting coincidence only in the last trace state in a decoding cycle.

8. A Viterbi decoder in accordance with claim 7, wherein said reading means includes means for reading node data from said trace memory means during the last trace state of a decoding cycle.

9. A Viterbi decoder in accordance with claim 7, wherein said reading means includes means for reading node data from said trace memory means during the first trace state sate of a decoding cycle.

10. A Viterbi decoder in accordance with claim 4 further comprising:

node determining means for determining a minimum path metric node on the basis of the path metrics calculated by the path selecting means; wherein the minimum path metric node determined by the node determining means is used as a starting node of the most likely path.

11. A Viterbi decoder in accordance with claim 10, wherein said storing means includes means for storing a minimum path metric node when said decoding is continued in another decoding cycle and for using the thus stored minimum path metric node as a starting node of the most likely path after the coincidence is detected.

12. A Viterbi decoder in accordance with claim 10, wherein said storing means includes means for storing a minimum path metric code number as said given node stored in said trace memory in a continued decoding cycle, and for using the thus stored minimum path metric node as a starting node of the most likely path after the coincidence is detected.

13. A Viterbi decoder in accordance with claim 10, wherein said storing means includes means for storing a dummy node as said given node stored in said trace memory in a continued decoding cycle, and for using the thus stored dummy node as a starting node on the most likely path after the coincidence is detected.

14. A Viterbi decoder in accordance with claim 10, wherein said storing means includes means for storing a dummy node as said given node stored in said trace memory means in a continued decoding cycle, and wherein said coincidence comparator means includes means for inhibiting said comparing in a continued decoding cycle, and said storing means includes means for storing, when said coincidence is inhibited, the node calculated by said node calculator means in said trace memory means.

15. A Viterbi decoder having decoding cycles for decoding a received signal, and having a plurality of nodes, each corresponding to a state of said decoder, comprising:

branch metric calculator means for calculating branch metrics for each of the nodes on the basis of the received signal;

path metric calculator means for calculating path metrics on the basis of said branch metrics;

path selecting means for selecting a surviving path metric for each of the nodes on the basis of said path metrics and for providing path selecting signals indicating the surviving paths;

path memory means for storing said path selecting signals generated by said path selecting means for each of the nodes;

node calculator means for determining a node of a most likely path based on one of said path selecting signals and a previously determined node;

trace memory means for storing said nodes, corresponding to the most likely path data, generated by said node calculator means; and means for providing a decoded signal on the basis of the nodes stored in said trace memory means, and for storing a given node in said trace memory means in each of said decoding cycles.

16. A Viterbi decoder in accordance with claim 13, further comprising:

minimum path metric node determining means for determining a minimum path metric node on the basis of said path metrics of each node calculated by the path selecting means;

detecting means for detecting completion of decoding of the received signal; and trace control means for restarting decoding of the received signal from a trace starting node which is set to the minimum path metric code determined by the minimum path metric node determining means when when completion of a previous decoding of the received signal is detected by the detecting means.

17. A Viterbi decoder in accordance with claim 16, wherein said trace control means includes means for addressing said trace memory means so as to circulate through addresses in both increment and decrement directions of the trace memory means, and for storing the most likely path and said given node in said trace memory means in opposite directions;

address coincidence detecting means for detecting coincidence of the address in both addressing directions and for inhibiting operation of said node calculator means when coincidence is detected by said address coincidence detecting means.

18. A Viterbi decoder in accordance with claim 15, wherein said trace control means includes means for addressing said trace memory means so as to circulate through addresses in both increment and decrement directions of the trace memory means, and for storing the most likely path and said given node in said trace memory means in opposite directions and non-correlatively.

19. A Viterbi decoder in accordance with claim 14, wherein said trace memory means has a length corresponding to a number of decoding cycles until coincidence is detected.

* * * * *

UNITED STATES PATENT AND TRADEMARK OFFICE
CERTIFICATE OF CORRECTION

PATENT NO. : 4,777,636

DATED : October 11, 1988

INVENTOR(S) : Atsushi Yamashita et al.

It is certified that error appears in the above-identified patent and that said Letters Patent is hereby corrected as shown below:

Col. 4, line 8, "$2^{k--1}$," should be --$2^{k-1}-1$,--;

Col. 5, line 22, "$N_{11}$;32" should be --$N_{11}$ = --;

Col. 12, line 67, "states" should be --state--.

Col. 21, line 16, "cycle" (second occurrence) should be --clock--;

line 55, before "path" insert --type--

Signed and Sealed this

Eleventh Day of April, 1989

Attest:

DONALD J. QUIGG

Attesting Officer

Commissioner of Patents and Trademarks